(12) United States Patent
Nakagawa

(10) Patent No.: US 6,696,329 B2
(45) Date of Patent: Feb. 24, 2004

(54) METHOD OF MANUFACTURING SEMICONDUCTOR DEVICE

(75) Inventor: Shinichi Nakagawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/270,285

(22) Filed: Oct. 15, 2002

(65) Prior Publication Data
US 2003/0181009 A1 Sep. 25, 2003

(30) Foreign Application Priority Data
Mar. 20, 2002 (JP) .......................... 2002-078419

(51) Int. Cl.$^7$ .................. H01L 21/8247; H01L 29/788
(52) U.S. Cl. .................. 438/201; 438/211; 438/257; 438/275
(58) Field of Search ................. 438/201, 211, 438/218, 221, 225, 257, 275, 279, 587, 588, 593

(56) References Cited

U.S. PATENT DOCUMENTS

| | | | | |
|---|---|---|---|---|
| 5,911,105 A | * | 6/1999 | Sasaki | 438/201 |
| 6,025,234 A | * | 2/2000 | Chou | 438/257 |
| 6,033,958 A | * | 3/2000 | Chou et al. | 438/275 |
| 6,037,201 A | * | 3/2000 | Tsai et al. | 438/275 |
| 6,174,756 B1 | * | 1/2001 | Gambino et al. | 438/184 |
| 6,225,167 B1 | * | 5/2001 | Yu et al. | 438/275 |
| 6,372,569 B1 | * | 4/2002 | Lee et al. | 438/279 |

OTHER PUBLICATIONS

Patent Abstracts of Japan, Publication No. 10–189777 dated Jul. 21, 1998.

\* cited by examiner

*Primary Examiner*—Wael Fahmy
*Assistant Examiner*—Anh Duy Mai
(74) *Attorney, Agent, or Firm*—Armstrong, Kratz, Quintos, Hanson & Brooks, LLP

(57) ABSTRACT

A silicon oxide film is formed by thermal oxidation on condition that the thickness thereof on the surface of a diffusion layer is about 3 nm. As a result, the silicon oxide film with a thickness of about 12 nm is formed on the surface of a source diffusion layer due to enhanced oxidation. Subsequently, after a silicon nitride film is formed on the entire surface, the silicon nitride film in a peripheral transistor region is removed. Thereafter, the resist film is removed, and thermal oxidation is performed in order to grow the silicon oxide film formed on the surface of the diffusion layer. On this occasion, the silicon oxide film formed on the surface of each of the source diffusion layer and the drain diffusion layer is covered with the silicon nitride film, and hence it does not grow.

17 Claims, 32 Drawing Sheets

METHOD OF MANUFACTURING SEMICONDUCTOR DEVICE

CROSS-REFERENCE TO RELATED APPLICATIONS

This application is based upon and claims priority of Japanese Patent Application No. 2002-078419, filed on Mar. 20, 2002, the contents being incorporated herein by reference.

BACKGROUND OF THE INVENTION

1. Field of the Invention

The present invention relates to a method of manufacturing a semiconductor device suitable for manufacturing a flash memory and a logic circuit or the like having the flash memory on board.

2. Description of the Related Art

In a nonvolatile memory such as a flash memory, as shown in FIG. 13, a memory cell array region 101 in which floating-gate type memory cells 103 are arranged in a matrix form and a peripheral transistor region 102 including a logic circuit (not shown) formed on the periphery of the memory cell array region 101 for controlling the operation of the memory cells 103 and the like are provided. In each of the memory cells 103, a control gate CG, a floating gate FG, a source diffusion layer S, and a drain diffusion layer D are provided. The control gate CG is shared by a plurality of memory cells 103 arranged in a direction in which the control gate CG itself extends. Similarly, the source diffusion layer S is shared by the plurality of memory cells 103 arranged in the direction in which the control gate CG extends. The source diffusion layer S is also shared by a plurality of memory cells 103 arranged perpendicularly to the direction in which the control gate CG extends. The drain diffusion layer D of each of the memory cells 103 is connected to the same bit line (not shown). In the logic circuit, a plurality of MOS transistors 104 and capacitors (not shown) and the like are formed. The MOS transistor 104 is provided with a source/drain diffusion layer SD and a gate electrode G.

Such a nonvolatile memory is manufactured by the following method. FIGS. 14A and 14B to FIGS. 32A and 32B are sectional views showing a conventional method of manufacturing a nonvolatile memory in the order of process steps. Incidentally, FIG. 14A to FIG. 32A are sectional views taken along the line I—I in FIG. 13, and FIG. 14B to FIG. 32B are sectional views taken along the line II—II in FIG. 13.

First, as shown in FIG. 14A and FIG. 14B, an element isolation insulating film 2a which defines the memory cell array region 101 and the peripheral transistor region 102, and element isolation insulating films 2b which define the memory cells 103 are formed in the surface of a semiconductor substrate 1 such as a P$^+$ silicon substrate. The element isolation insulating films 2a and 2b can be formed, for example, by an STI (Shallow trench isolation) or LOCOS (Local oxidation of silicon) method.

Then, as shown in FIG. 15A and FIG. 15B, an N-well 1a is formed on the surface of the semiconductor substrate 1 in the peripheral transistor region 102, and thereafter a tunnel oxide film 3 is formed on the surface of the semiconductor substrate 1 in each of element forming regions.

Subsequently, as shown in FIG. 16A and FIG. 16B, a polycrystalline silicon film 4 is formed on the entire surface.

A resist film 5 is formed on the polycrystalline silicon film 4, and openings 5a are formed in regions of the resist film 5 which match with the element isolating films 2b by photolithography technology. The polycrystalline silicon film 4 is patterned by etching the polycrystalline silicon film 4 with the resist film 5 as a mask.

Thereafter, as shown in FIG. 17A and FIG. 17B, the resist film 5 is removed, and an insulating film 6 is formed on the entire surface.

Subsequently, as shown in FIG. 18A and FIG. 18B, a resist film 7 which allows the peripheral transistor region 102 to be exposed is formed.

As shown in FIG. 19A and FIG. 19B, the insulating film 6, the polycrystalline silicon film 4, and the tunnel insulating film 3 in the peripheral transistor region 102 are removed by etching with the resist film 7 as a mask.

As shown in FIG. 20A and FIG. 20B, the resist film 7 is removed, and a gate insulating film 8 is formed on the surface of the well 1a in the element forming region of the peripheral transistor region 102. Moreover, a polycrystalline silicon film 9 and a silicon nitride film 10 as an antireflection film are formed in sequence on the entire surface.

Thereafter, as shown in FIG. 21A and FIG. 21B, a resist film 11 for covering each of regions where the control gate electrodes of the memory cells 103 are formed and each of regions where the gate electrodes of the MOS transistors 104 are formed is formed on the silicon nitride film 10.

Subsequently, as shown in FIG. 22A and FIG. 22B, the silicon nitride film 10 and the polycrystalline film 9 are removed with the resist film 11 as a mask.

As shown in FIG. 23A and FIG. 23B, the resist film 11 is removed, and a resist film 12 which allows the memory cell array region 101 to be exposed is formed.

As shown in FIG. 24A and FIG. 24B, the insulating film 6 and the polycrystalline film 4 are removed with the resist film 12 and the silicon nitride film 10 as the antireflection films as masks.

Thereafter, as shown in FIG. 25A and FIG. 25B, arsenic is doped as an N-type impurity into the surface of the semiconductor substrate 1 in a self-alignment manner by an impurity doping technique, so that a source diffusion layer 13S and a drain diffusion layer D are formed. Furthermore, the resist film 12 is removed, and phosphorous is doped into only the source diffusion layer 13S by the impurity doping technique with a resist film (not shown) in which an opening is formed only in a region matching with the source diffusion layer 13S as a mask.

Subsequently, as shown in FIG. 26A and FIG. 26B, the resist film 12 is removed, and a resist film 14 which allows the peripheral transistor region 102 to be exposed is formed. A low-concentration diffusion layer 15 is then formed by doping a P-type impurity into the surface of the well 1a in the self-alignment manner by means of the impurity doping technique.

As shown in FIG. 27A and FIG. 27B, the resist film 14 is removed, and a silicon oxide film (not shown) is formed on the entire surface, for example, by a chemical vapor deposition (CVD) method. By subjecting this silicon oxide film to anisotropic etching, a sidewall insulating film (sidewall spacer) 16 is formed on each side of the silicon nitride film 10, the polycrystalline silicon film 9, the insulating film 6, and the polycrystalline silicon film 4 in the memory cell array region 101 and the silicon nitride film 10 and the polycrystalline silicon film 9 in the peripheral transistor region 102.

Subsequently, as shown in FIG. 28A and FIG. 28B, a silicon oxide film 17 is formed on the surface of each of the source diffusion layer 13S, the drain diffusion layer 13D, and the low concentration diffusion layer 15 by surface oxidation. On this occasion, the thickness of the silicon oxide film 17 formed on the surface of the source diffusion layer 13S, into which the higher-concentration impurity is doped, is largest due to oxidation enhanced diffusion (enhanced oxidation).

Thereafter, as shown in FIG. 29A and FIG. 29B, the silicon nitride film 10 is removed by wet processing. On this occasion, the silicon oxide film 17 is formed on the surface of each of the source diffusion layer 13S, the drain diffusion layer 13D, and the low-concentration diffusion layer 15, and hence these diffusion layers are not damaged.

Subsequently, as shown in FIG. 30A and FIG. 30B, after a resist film 18 which allows the peripheral transistor region 102 to be exposed is formed, a high-concentration diffusion layer 19 is formed by doping a p-type impurity with a higher concentration than when the low-concentration diffusion layer 15 is formed into the surface of the semiconductor substrate 1 in the self-alignment manner by the impurity doping technique. A source/drain diffusion layer 20 with an LDD structure is composed of the low-concentration diffusion layer 15 and the high-concentration diffusion layer 19.

Thereafter, as shown in FIG. 31A and FIG. 31B, the resist film 18 is removed, the silicon oxide film 17 is removed by the wet processing, and a stacked film (not shown) composed of a Co film and a TiN film is formed on the entire surface. The stacked film and each of the source diffusion layer 13S, the drain diffusion layer 13D, the source/drain diffusion layer 20, and the polycrystalline silicon film 9 are reacted with each other by RTA (Rapid thermal Annealing) to form a metal reaction layer (CoSi layer) 21. Moreover, after the unreacted stacked film is removed, RTA is performed so that the resistance of the metal reaction layer 21 is lowered. In other words, the metal layer 21 with a low resistance value is formed by a salicide process.

Subsequently, as shown in FIG. 32A and FIG. 32B, a bulk interlayer insulating film 22 is formed on the entire surface. Thereafter, the formation of contact holes in the interlayer insulation film 22, the formation of wires, and so on are performed by a well-known method, and thus the nonvolatile memory is completed.

In the aforementioned conventional manufacturing method, however, as described above, the thickness of the silicon oxide film 17 is largest in its portion which is formed on the surface of the source diffusion layer 13S due to enhanced oxidation. The silicon oxide film 17 is removed by the wet processing for removing the silicon nitride film 10 and by the wet processing before the salicide process, but there is a problem that the silicon oxide film 17 formed on the surface of the source diffusion layer 13S is not fully removed because it is thick. If the silicon oxide film 17 remains on the source diffusion layer 13S, this hinders the formation of the CoSi layer 21. Therefore, the wet processing before the salicide process is performed sufficiently. However, when the time of the wet processing is lengthened, a bird's beak recedes in case that the element isolation insulating films 2a and 2b are formed by LOCOS, and in case that they are formed by STI, the promotion of an STI divot (Oxide Recess) is accelerated so that junction leakage at an end portion of an active region is increased. Moreover, there is a possibility that the sidewall oxide film 16 recedes so that desired reliability and element characteristic (especially, retention characteristic of the nonvolatile memory and the like) is not obtained. Such a situation is marked in the nonvolatile memory.

SUMMARY OF THE INVENTION

The present invention is made in view of the aforementioned problem, and its object is to provide a method of manufacturing a semiconductor device capable of easily removing an oxide film formed by enhanced oxidation in a memory cell array region even if an oxide film with a sufficient thickness is formed as a protective film on the surface of a diffusion layer of a peripheral transistor region.

The present inventor attained to aspects of the invention shown below as a result of earnest examination.

A method of manufacturing a semiconductor device according to the present invention is a method of manufacturing a semiconductor device comprising a memory cell array region and a peripheral transistor region provided on the periphery of the memory cell array region. This method of manufacturing the semiconductor device is characterized by comprising the steps of: forming a diffusion layer provided in each of memory cells in the memory cell array region and a diffusion layer provided in the peripheral transistor region on the surface of a semiconductor substrate; forming a silicon oxide film on the surface of each of the diffusion layers by oxidation treatment; and thickening the silicon oxide film only in the peripheral transistor region by subsequent oxidation treatment.

In the present invention, after the silicon oxide film is formed on the surface of each of the diffusion layers, the silicon oxide film only in the peripheral transistor region is thickened, whereby the silicon oxide film in the memory cell array region can avoid being thickened more than necessary. Accordingly, defects such as recession of a bird's beak, an increase in junction leakage, and recession of a sidewall oxide film which conventionally occur when the silicon oxide films in the memory cell array region and the peripheral transistor region are removed, that is, when the wet processing is performed before a salicide process can be prevented.

DETAILED DESCRIPTION OF THE PREFERRED EMBODIMENTS

Figure 13:
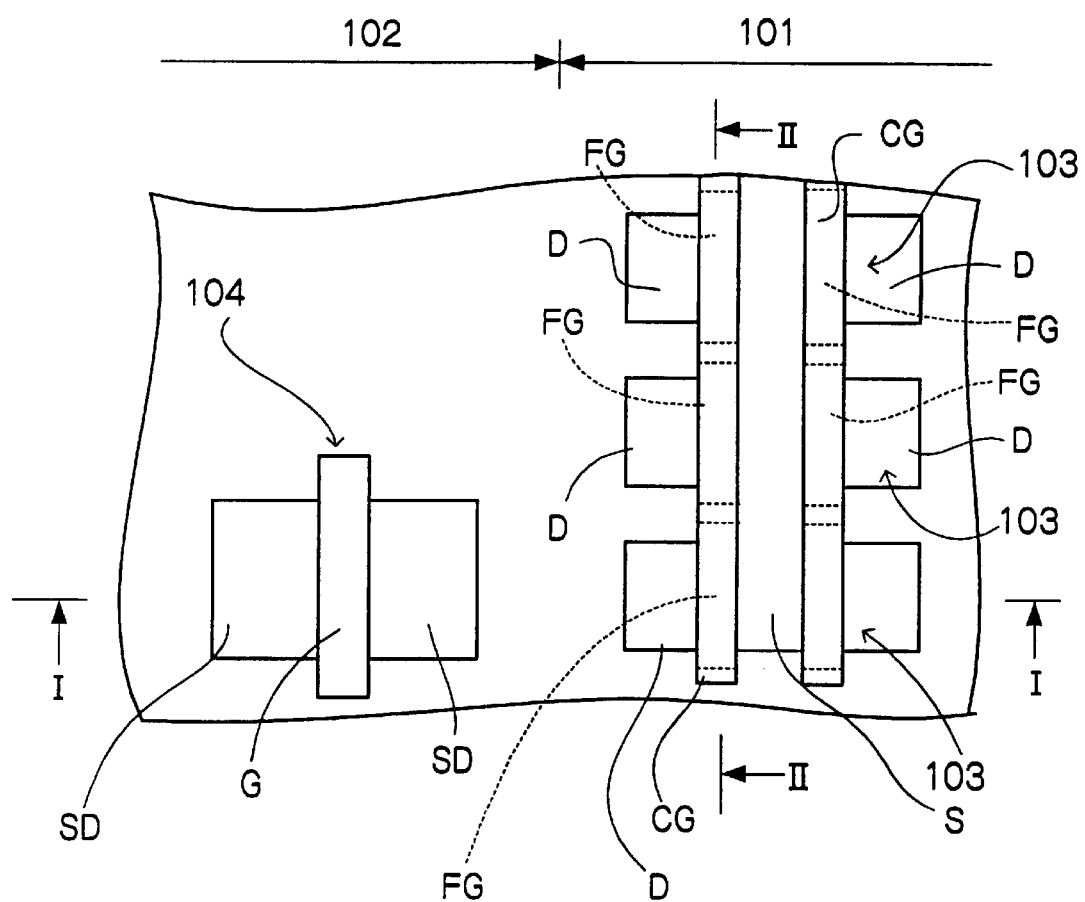
FIG. 13 is a schematic view showing a schematic layout of a nonvolatile memory.

A method of manufacturing a semiconductor device according to an embodiment of the present invention will be concretely explained below with reference to the attached drawings. In this embodiment, a semiconductor device (nonvolatile memory) shown in FIG. 13 is manufactured. FIGS. 1A and 1B to FIGS. 11A and 11B are sectional views showing the method of manufacturing the semiconductor device according to the embodiment of the present invention in the order of process steps.

Figure 1A:
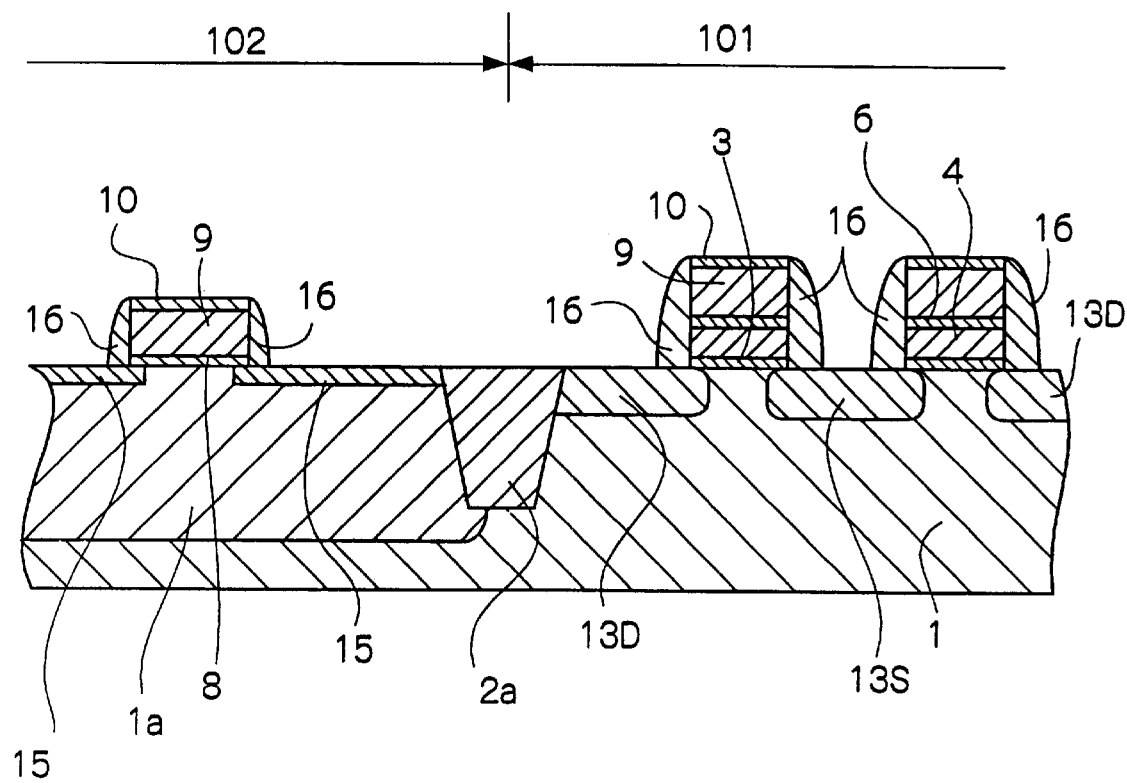
FIG. 1A and FIG. 1B are sectional views showing a method of manufacturing a semiconductor device according to an embodiment of the present invention.
Figure 1B:
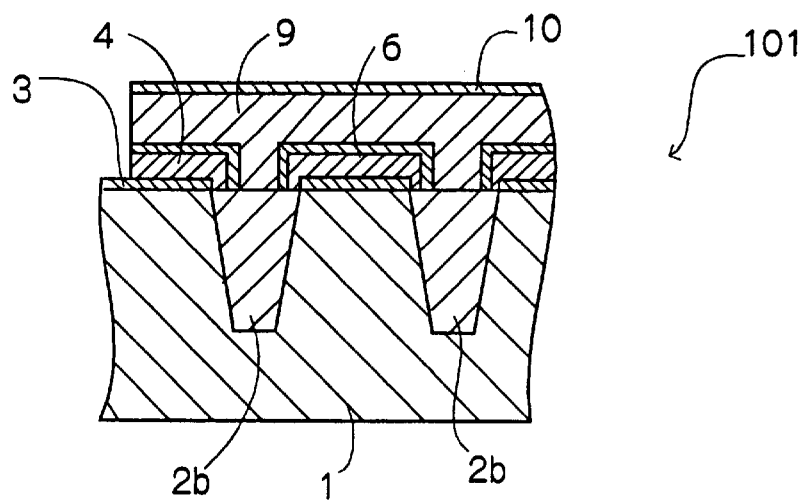
Figure 2A:
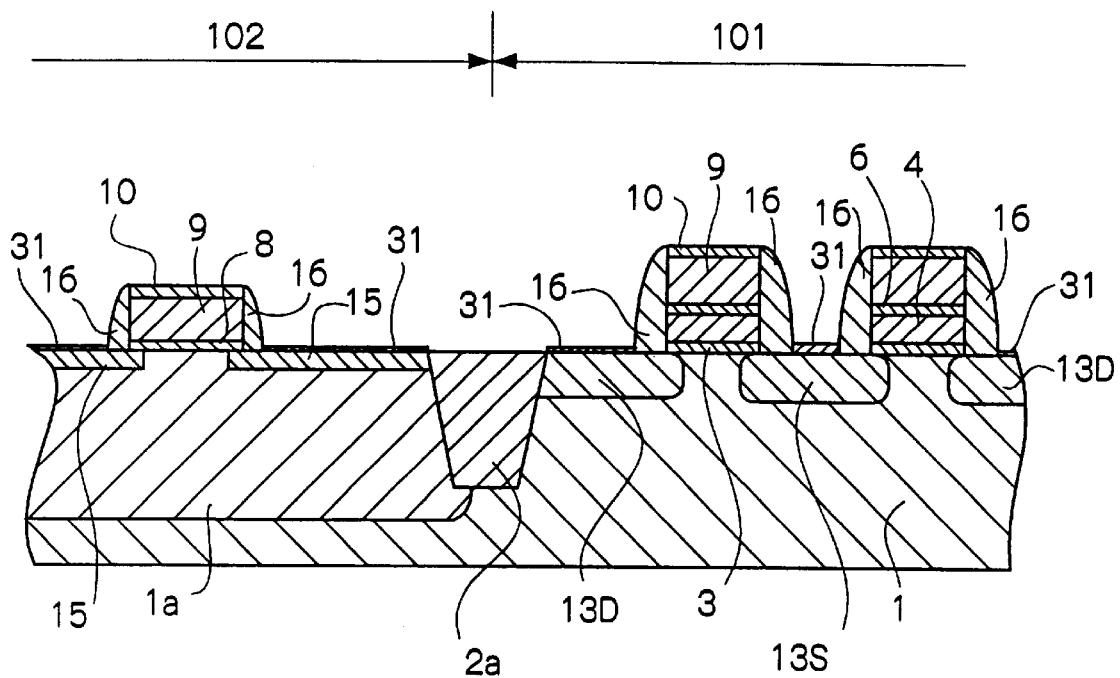
FIG. 2A and FIG. 2B are sectional views showing the method of manufacturing the semiconductor device according to the embodiment of the present invention and showing a step subsequent to a step shown in FIG. 1A and FIG. 1B.
Figure 2B:
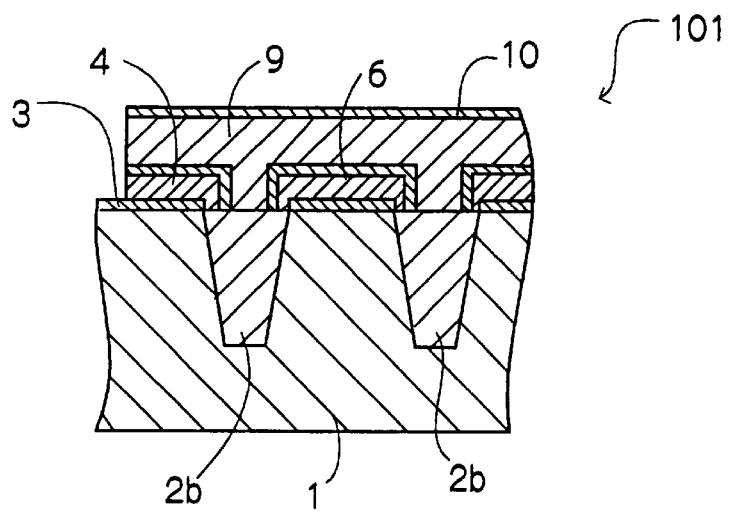

First, a structure such as shown in FIG. 1A and FIG. 1B is obtained by performing the same steps as the conventional steps shown in FIGS. 14A and 14B to FIGS. 27A and 27B.

Figure 14A:
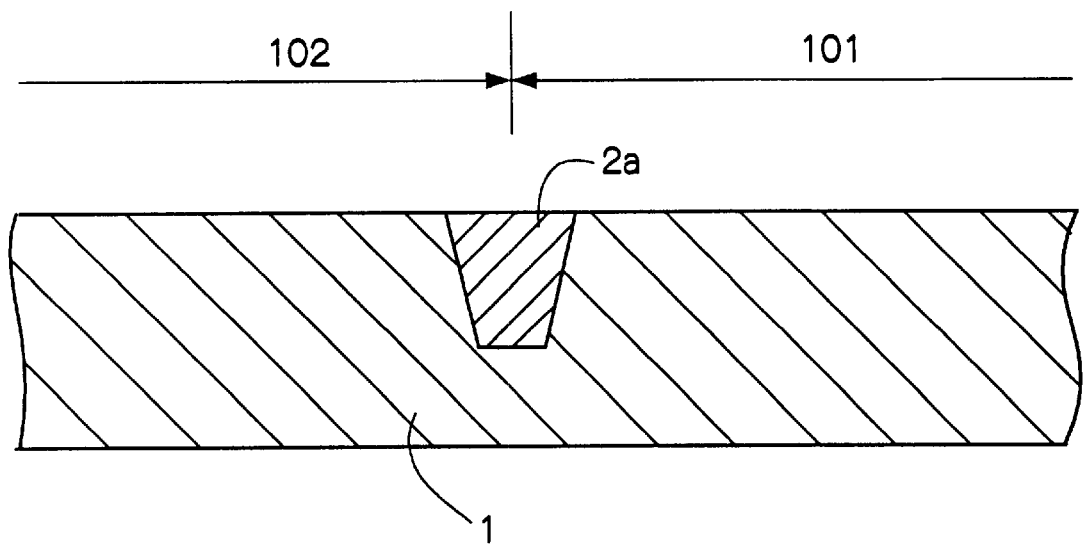
FIG. 14A and FIG. 14B are sectional views showing a conventional method of manufacturing the nonvolatile memory.
Figure 14B:
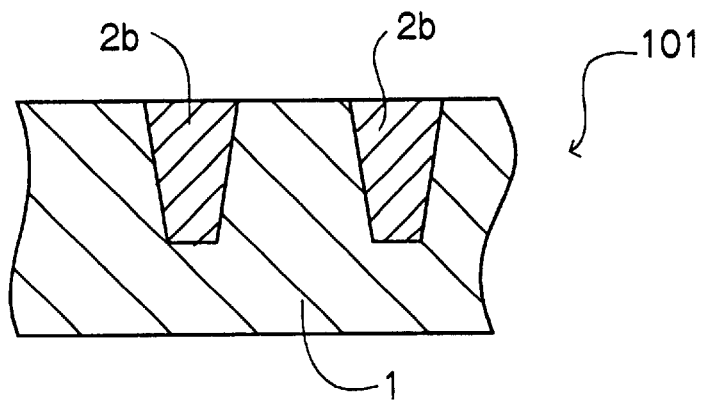

More specifically, element isolation insulating films 2a and 2b shown in FIG. 14A and FIG. 14B may be formed by performing the following steps. First, an $SiO_2$ film (not shown) is formed on the surface of a $P^+$ semiconductor substrate 1 as a thermally-oxidized film, and an insulating film (not shown) such as an $Si_3N_4$ film is formed thereon. The thicknesses of the $SiO_2$ film and the insulating films such as the $Si_3N_4$ film are, for example, 12 nm and 20 nm, respectively. Then, by etching element isolation regions of the semiconductor substrate 1 using a hard mask formed by means of patterning, trenches (not shown) with a depth of about 300 nm, for example, are formed. Subsequently, an oxide film (not shown) such as a high-density plasma oxide film (HDP) is deposited in each of these trenches to have a thickness of 700 nm, for example, and planarized by chemical mechanical polishing (CMP). The $SiO_2$ film and the insulating films such as the $Si_3N_4$ film, which are stopper films, are then removed. Thus, the element isolation insulating films 2a and 2b can be formed by STI (See FIG. 14A and FIG. 14B).

Figure 15A:
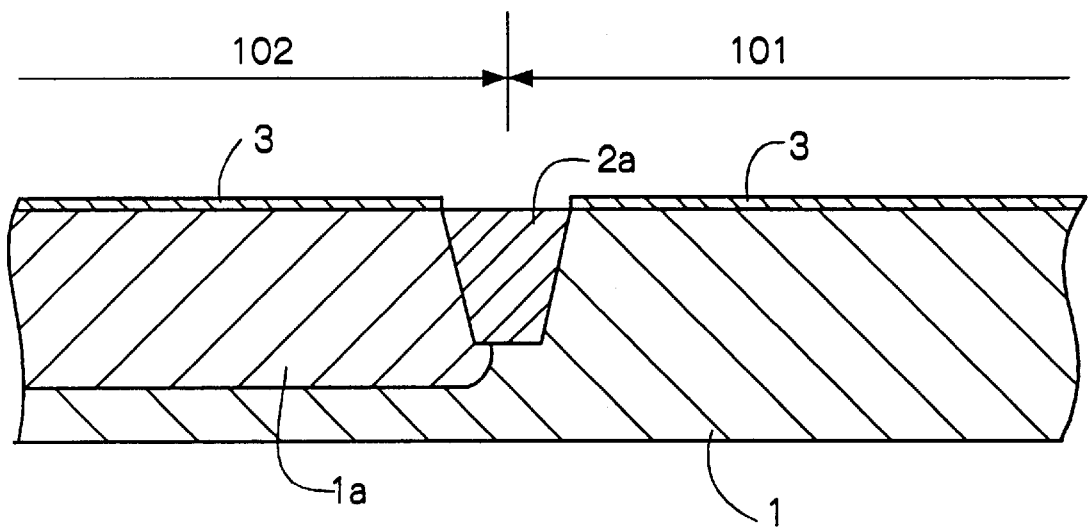
FIG. 15A and FIG. 15B are sectional views showing the conventional method of manufacturing the nonvolatile memory and showing a step subsequent to a step shown in FIG. 14A and FIG. 14B.
Figure 15B:
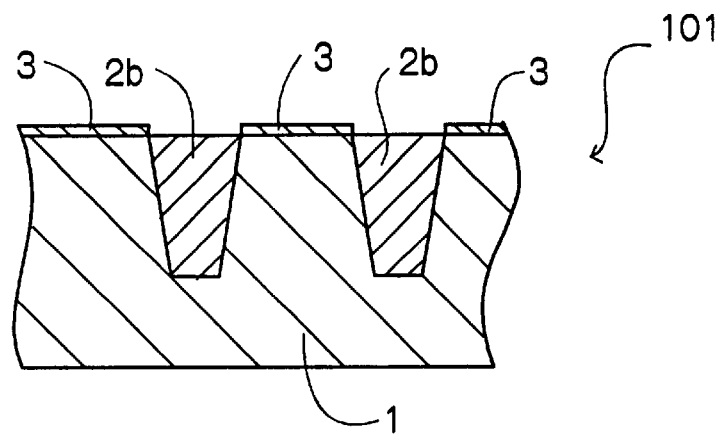
Figure 16A:
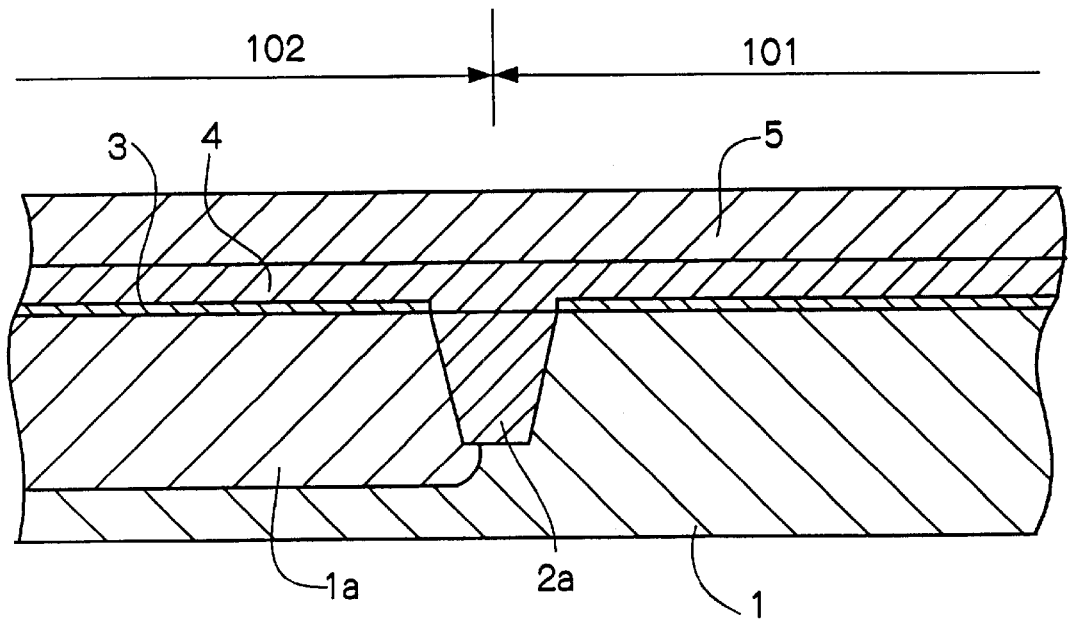
FIG. 16A and FIG. 16B are sectional views showing the conventional method of manufacturing the nonvolatile memory and showing a step subsequent to the step shown in FIG. 15A and FIG. 15B.
Figure 16B:
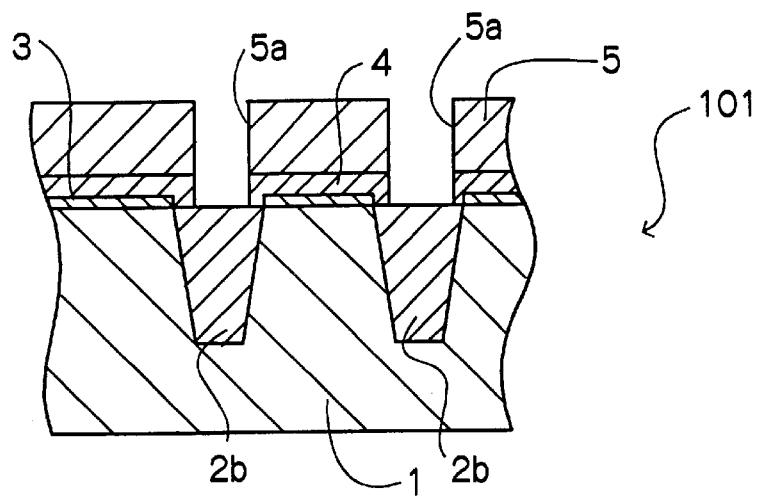
Figure 17A:
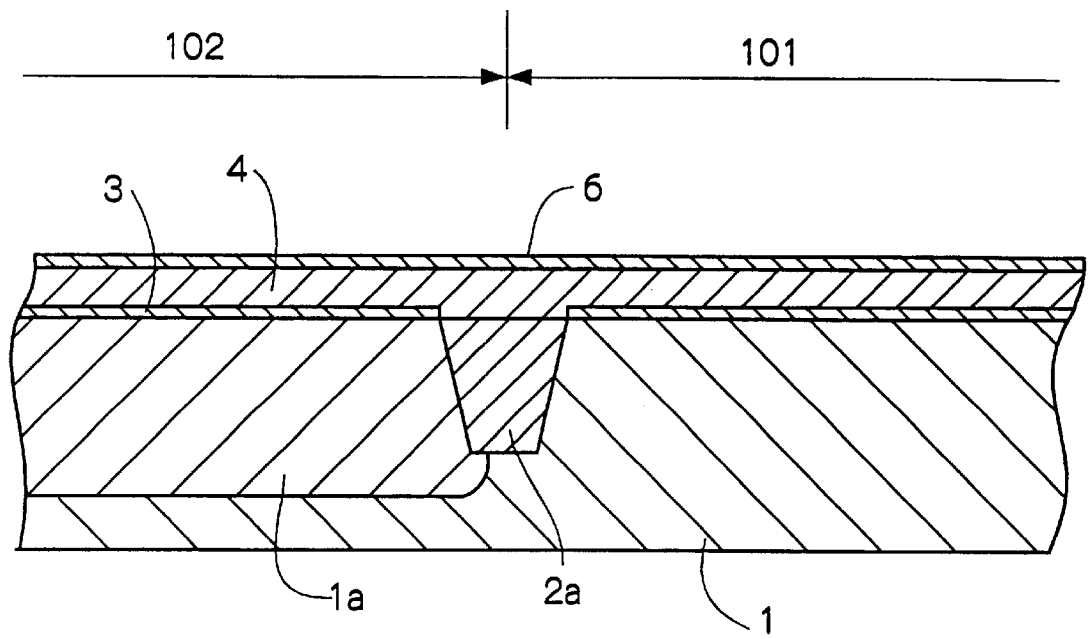
FIG. 17A and FIG. 17B are sectional views showing the conventional method of manufacturing the nonvolatile memory and showing a step subsequent to the step shown in FIG. 16A and FIG. 16B.
Figure 17B:
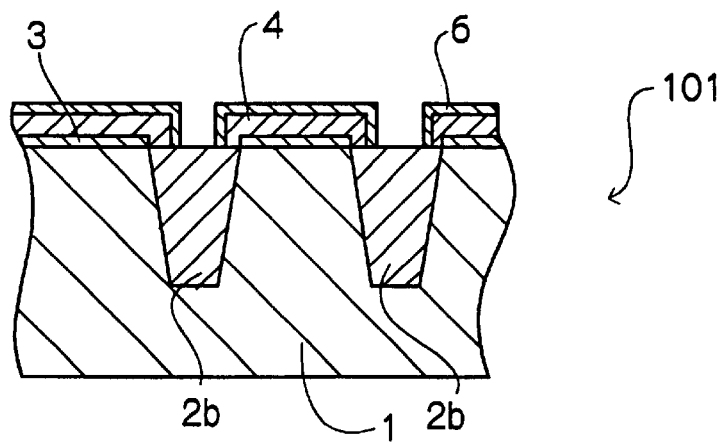
Figure 18A:
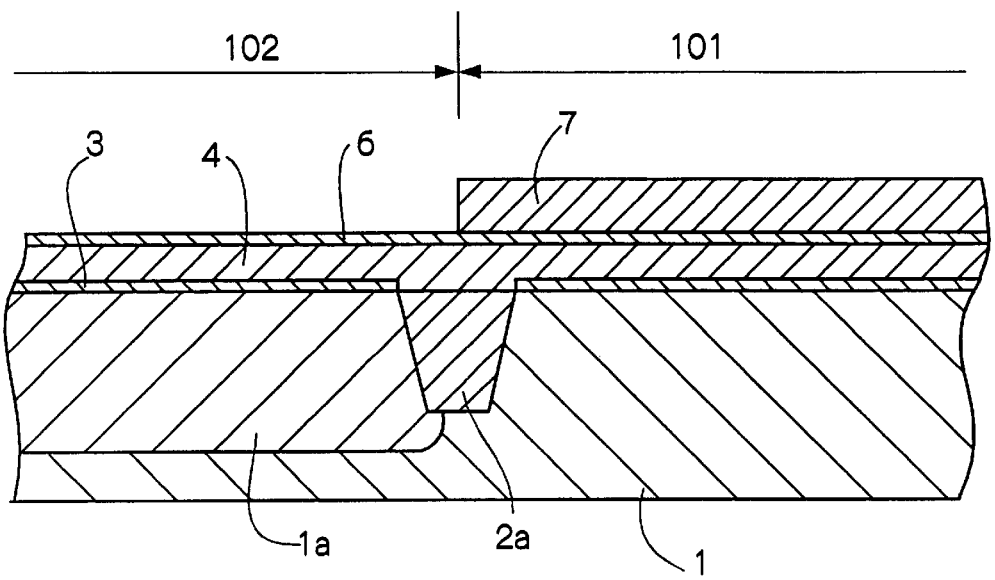
FIG. 18A and FIG. 18B are sectional views showing the conventional method of manufacturing the nonvolatile memory and showing a step subsequent to the step shown in FIG. 17A and FIG. 17B.
Figure 18B:
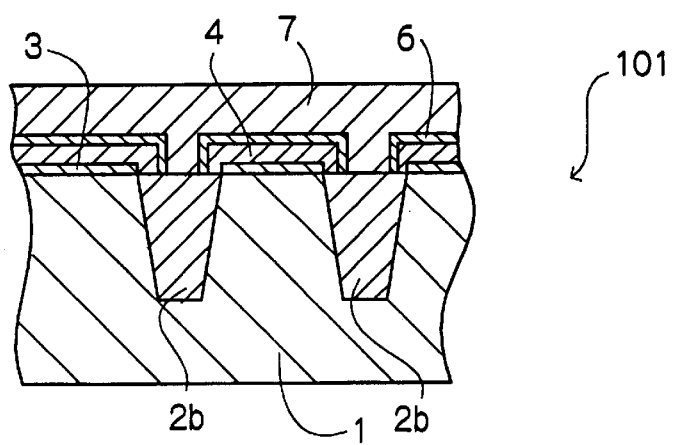
Figure 19A:
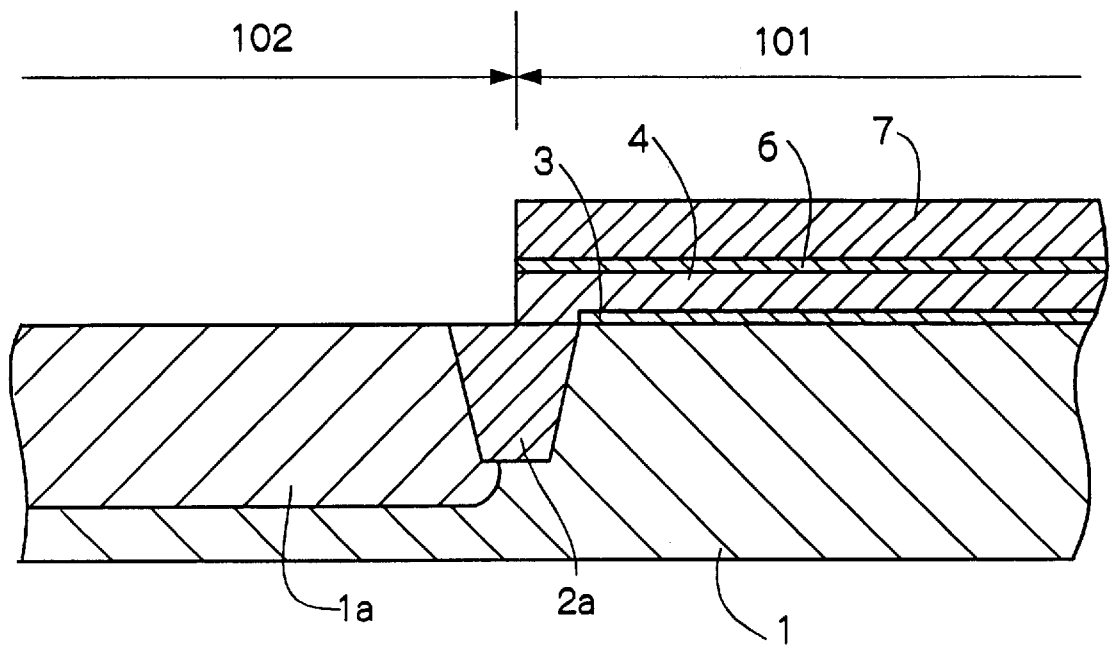
FIG. 19A and FIG. 19B are sectional views showing the conventional method of manufacturing the nonvolatile memory and showing a step subsequent to the step shown in FIG. 18A and FIG. 18B.
Figure 19B:
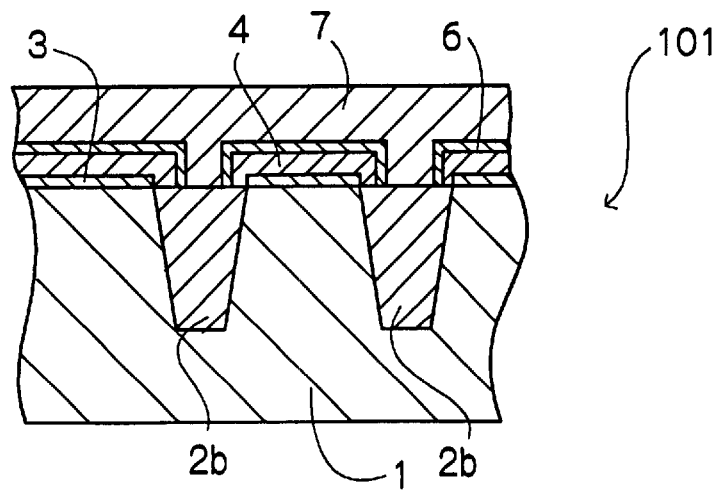
Figure 20A:
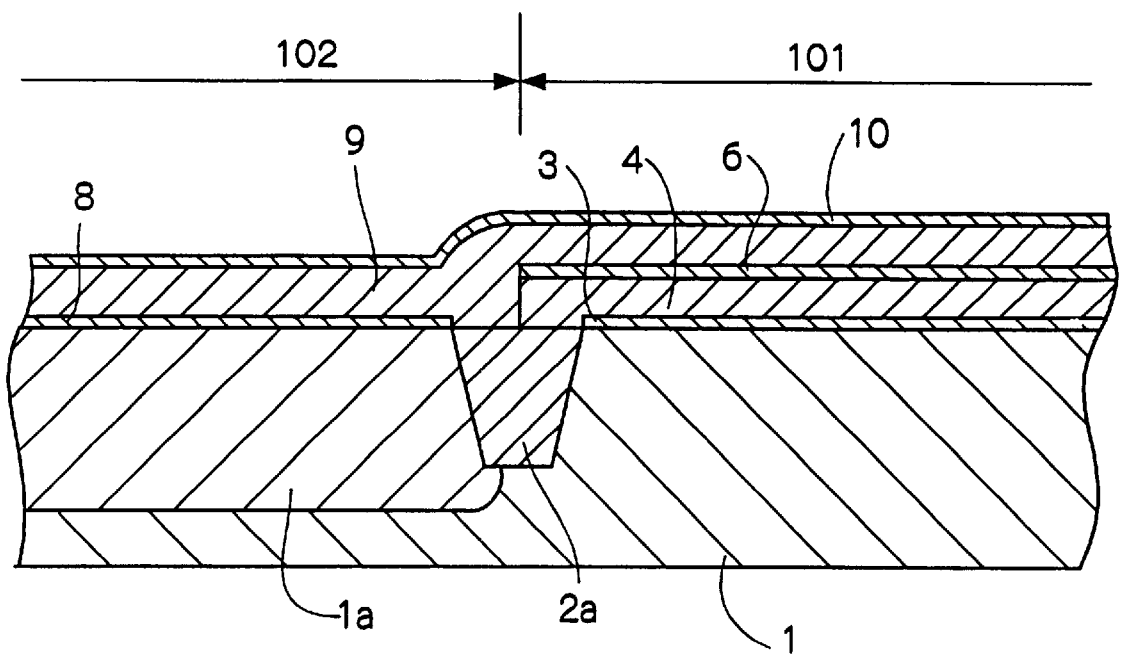
FIG. 20A and FIG. 20B are sectional views showing the conventional method of manufacturing the nonvolatile memory and showing a step subsequent to the step shown in FIG. 19A and FIG. 19B.
Figure 20B:
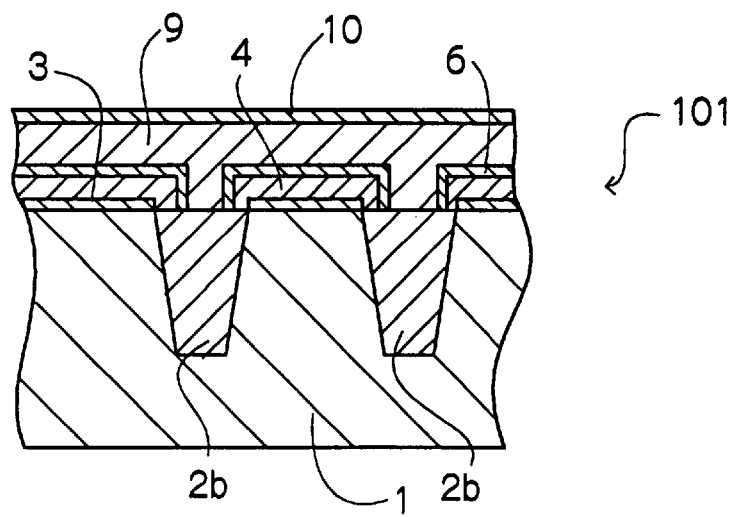
Figure 21A:
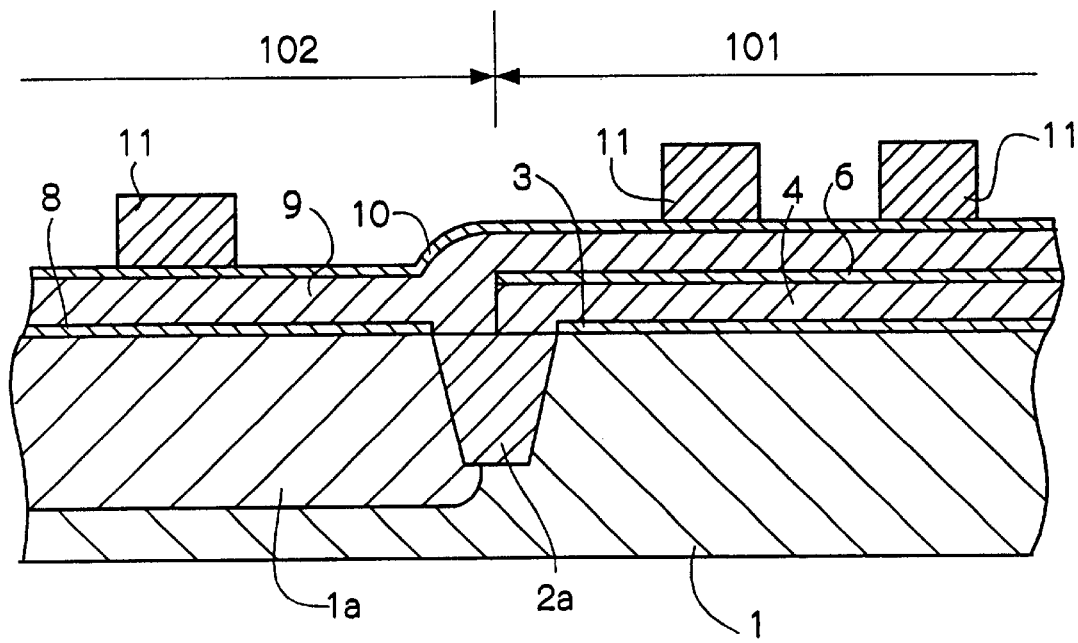
FIG. 21A and FIG. 21B are sectional views showing the conventional method of manufacturing the nonvolatile memory and showing a step subsequent to the step shown in FIG. 20A and FIG. 20B.
Figure 21B:
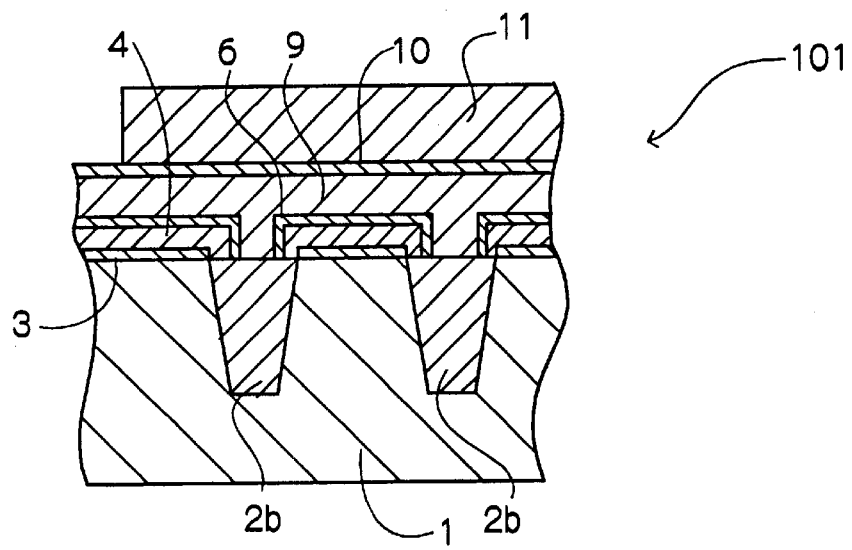
Figure 22A:
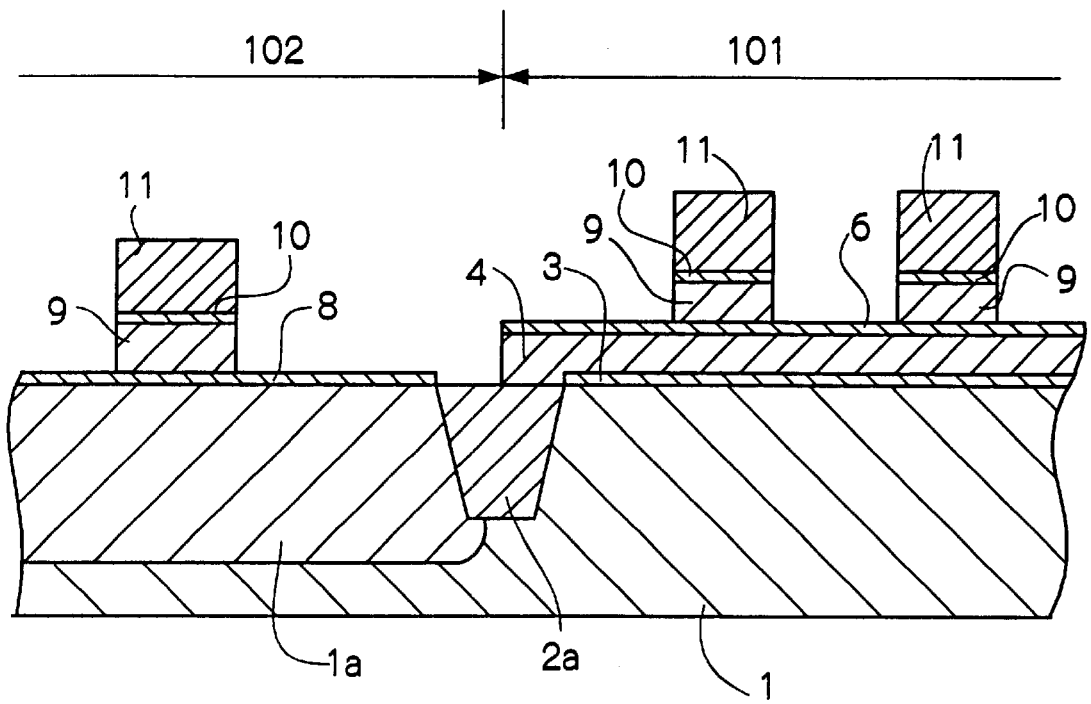
FIG. 22A and FIG. 22B are sectional views showing the conventional method of manufacturing the nonvolatile memory and showing a step subsequent to the step shown in FIG. 21A and FIG. 21B.
Figure 22B:
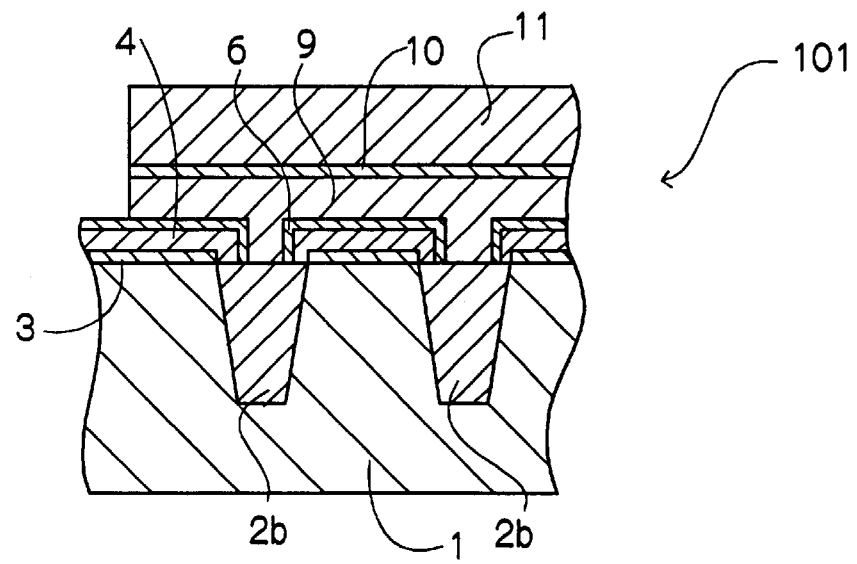
Figure 23A:
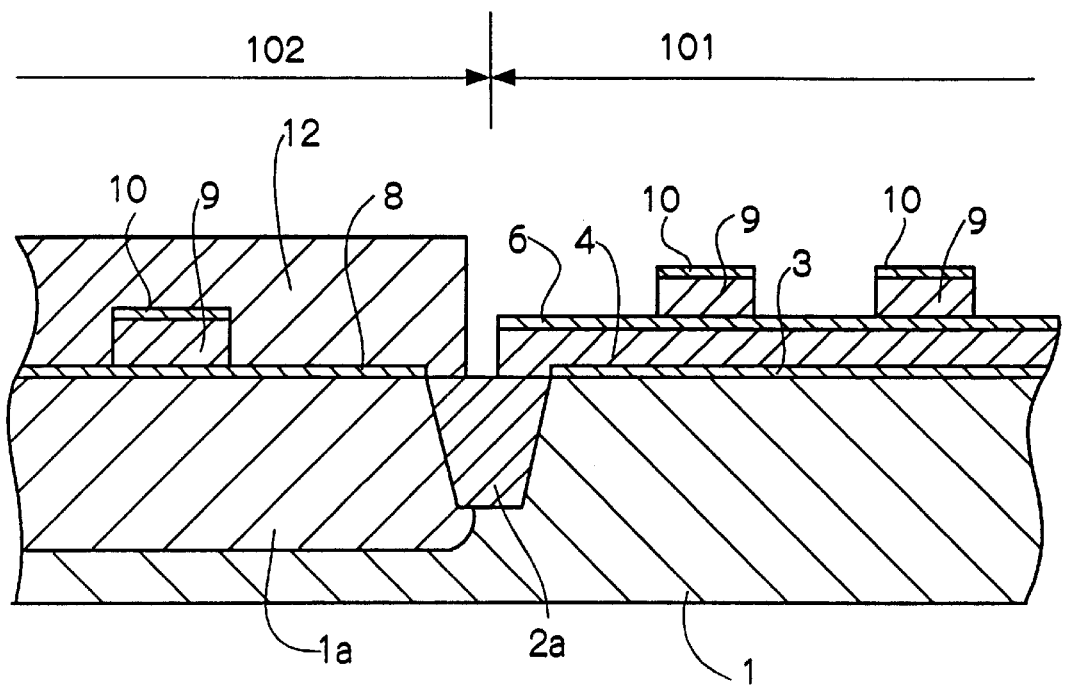
FIG. 23A and FIG. 23B are sectional views showing the conventional method of manufacturing the nonvolatile memory and showing a step subsequent to the step shown in FIG. 22A and FIG. 22B.
Figure 23B:
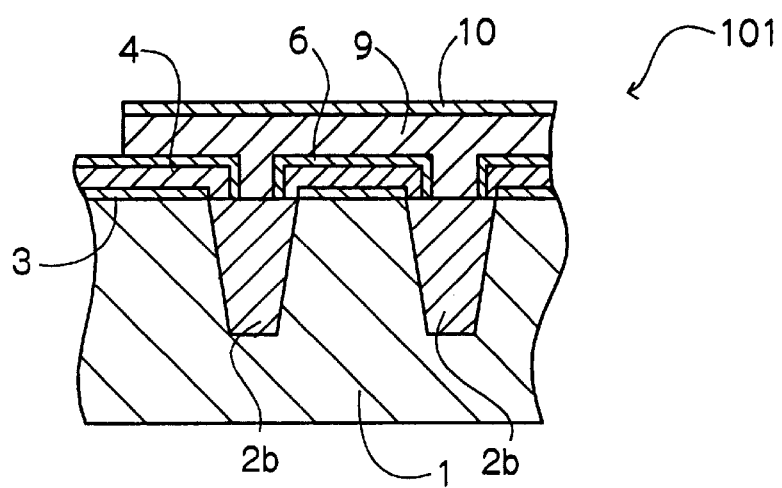
Figure 24A:
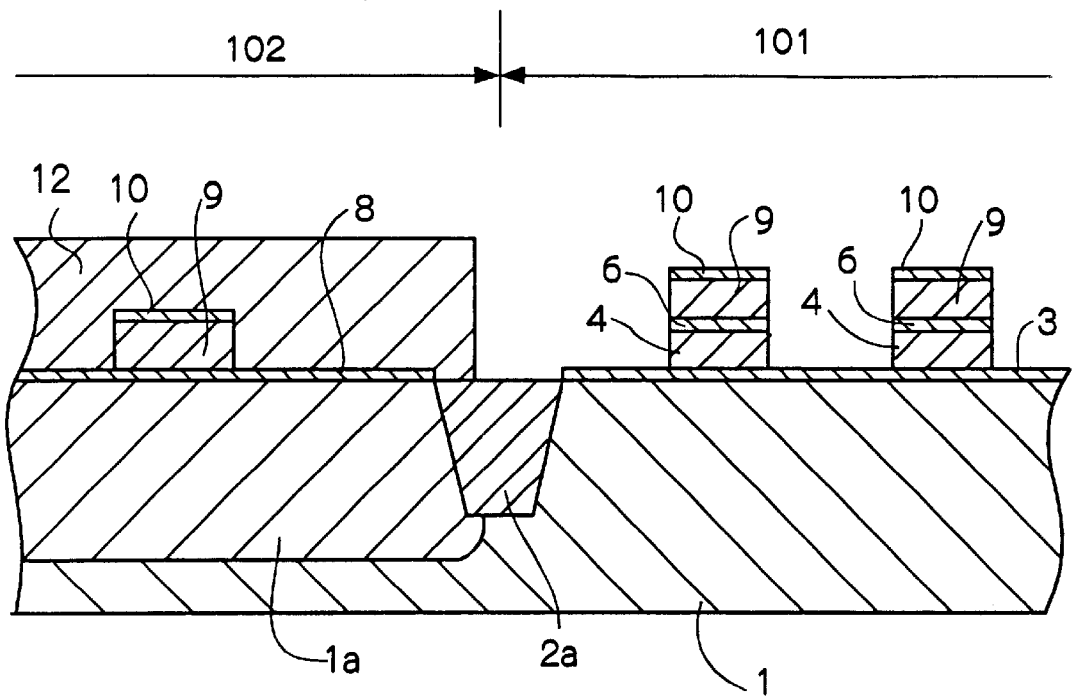
FIG. 24A and FIG. 24B are sectional views showing the conventional method of manufacturing the nonvolatile memory and showing a step subsequent to the step shown in FIG. 23A and FIG. 23B.
Figure 24B:
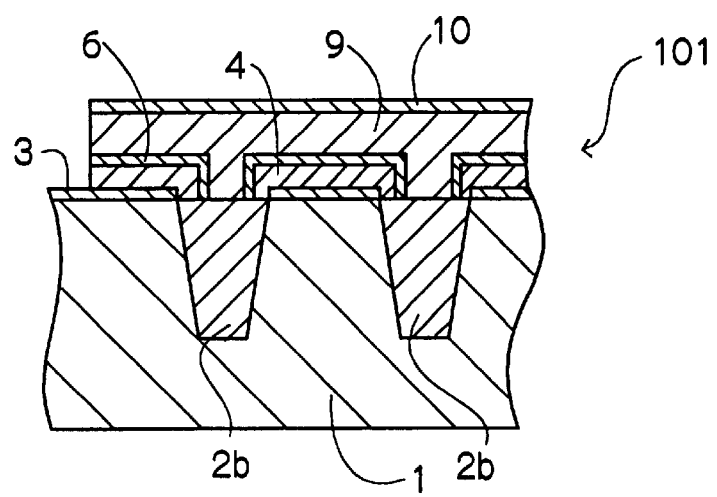
Figure 25A:
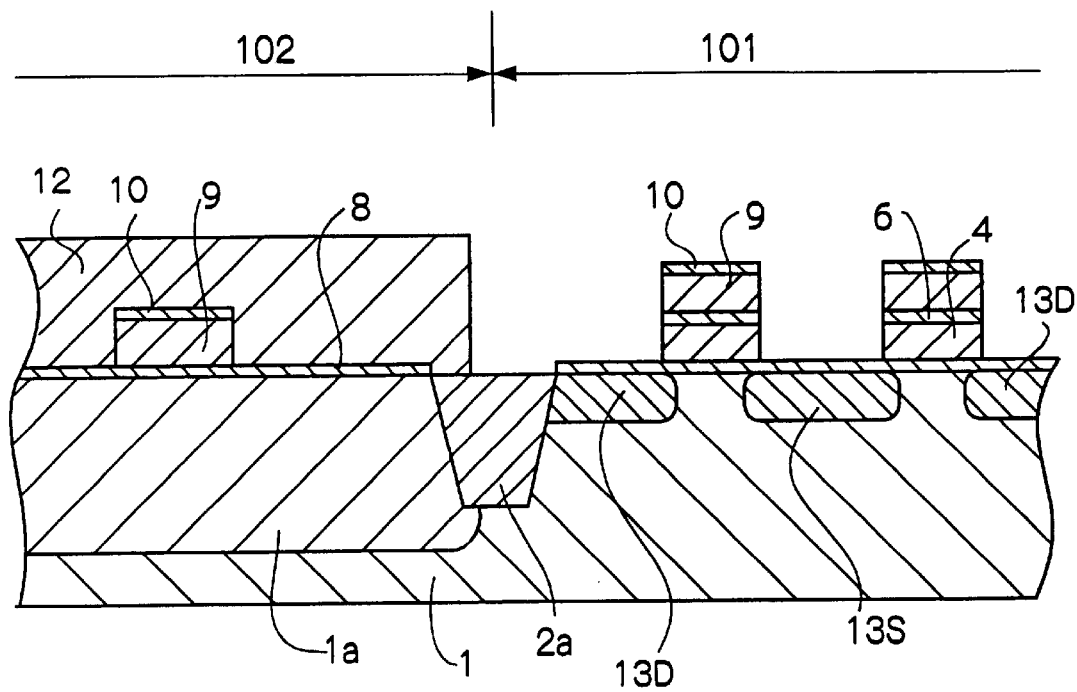
FIG. 25A and FIG. 25B are sectional views showing the conventional method of manufacturing the nonvolatile memory and showing a step subsequent to the step shown in FIG. 24A and FIG. 24B.
Figure 25B:
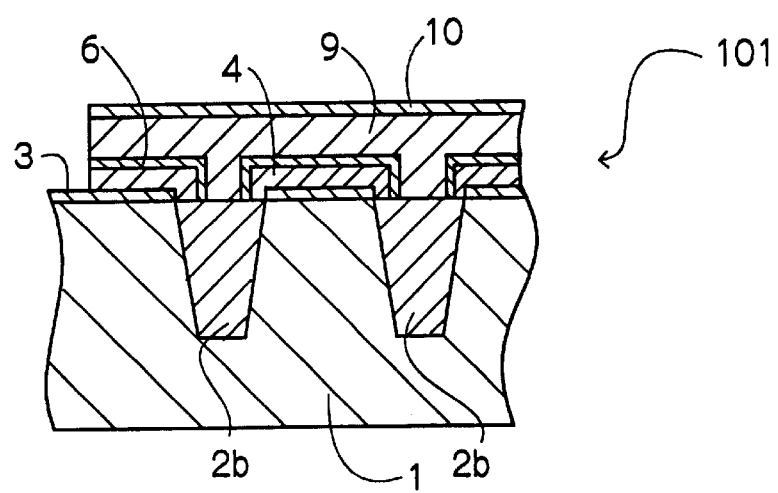
Figure 26A:
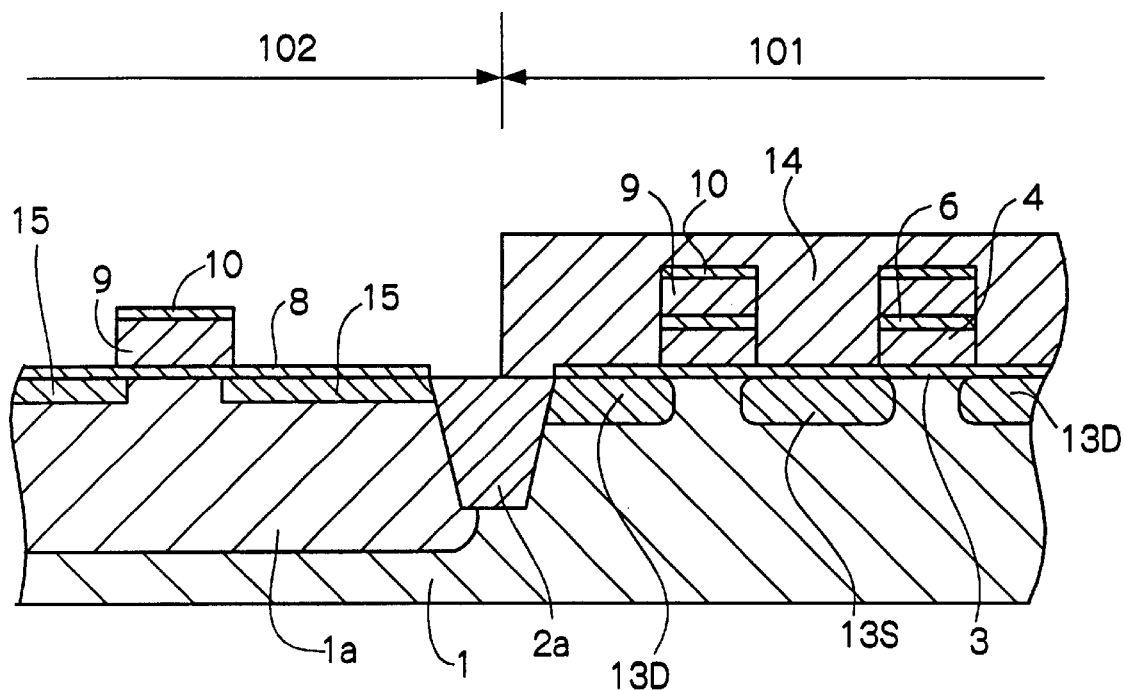
FIG. 26A and FIG. 26B are sectional views showing the conventional method of manufacturing the nonvolatile memory and showing a step subsequent to the step shown in FIG. 25A and FIG. 25B.
Figure 26B:
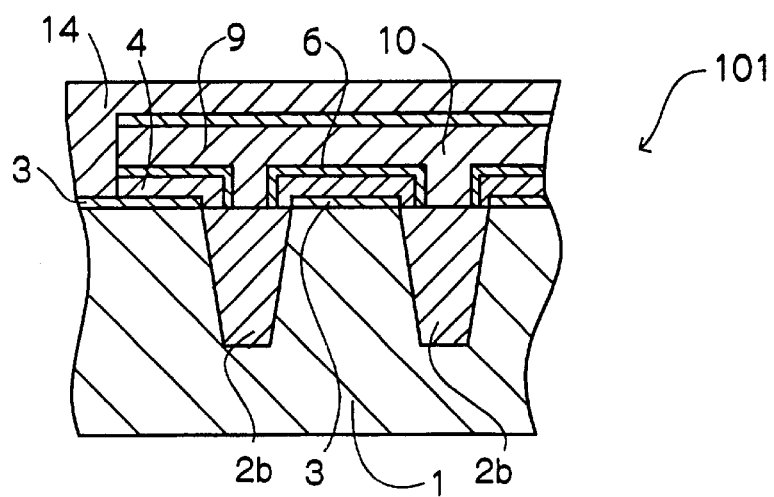
Figure 27A:
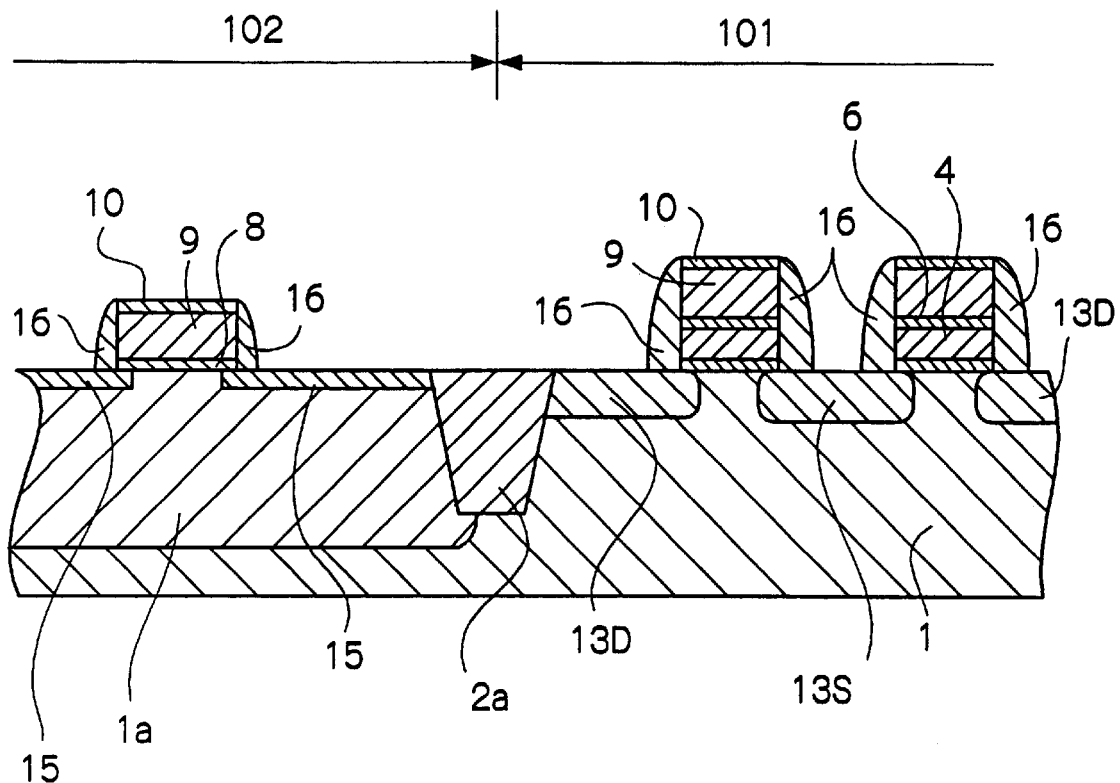
FIG. 27A and FIG. 27B are sectional views showing the conventional method of manufacturing the nonvolatile memory and showing a step subsequent to the step shown in FIG. 26A and FIG. 26B.
Figure 27B:
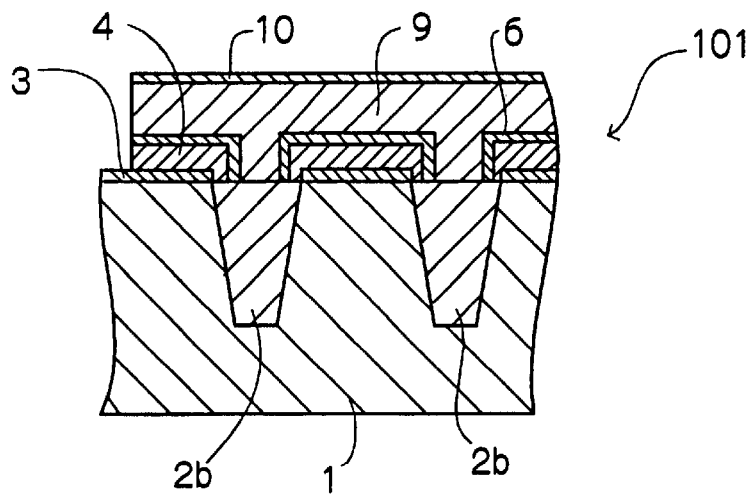
Figure 28A:
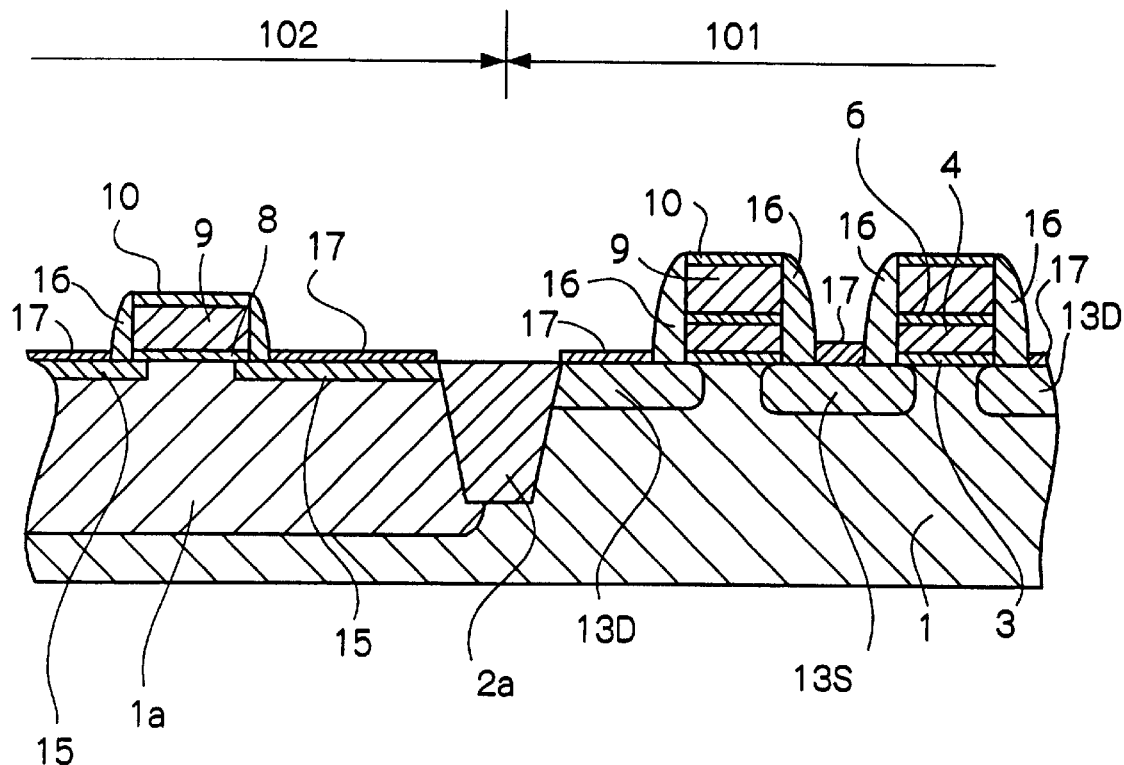
FIG. 28A and FIG. 28B are sectional views showing the conventional method of manufacturing the nonvolatile memory and showing a step subsequent to the step shown in FIG. 27A and FIG. 27B.
Figure 28B:
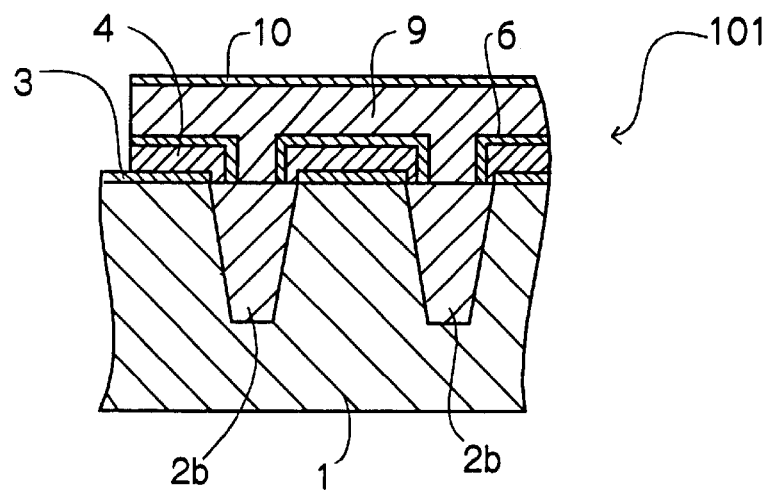
Figure 29A:
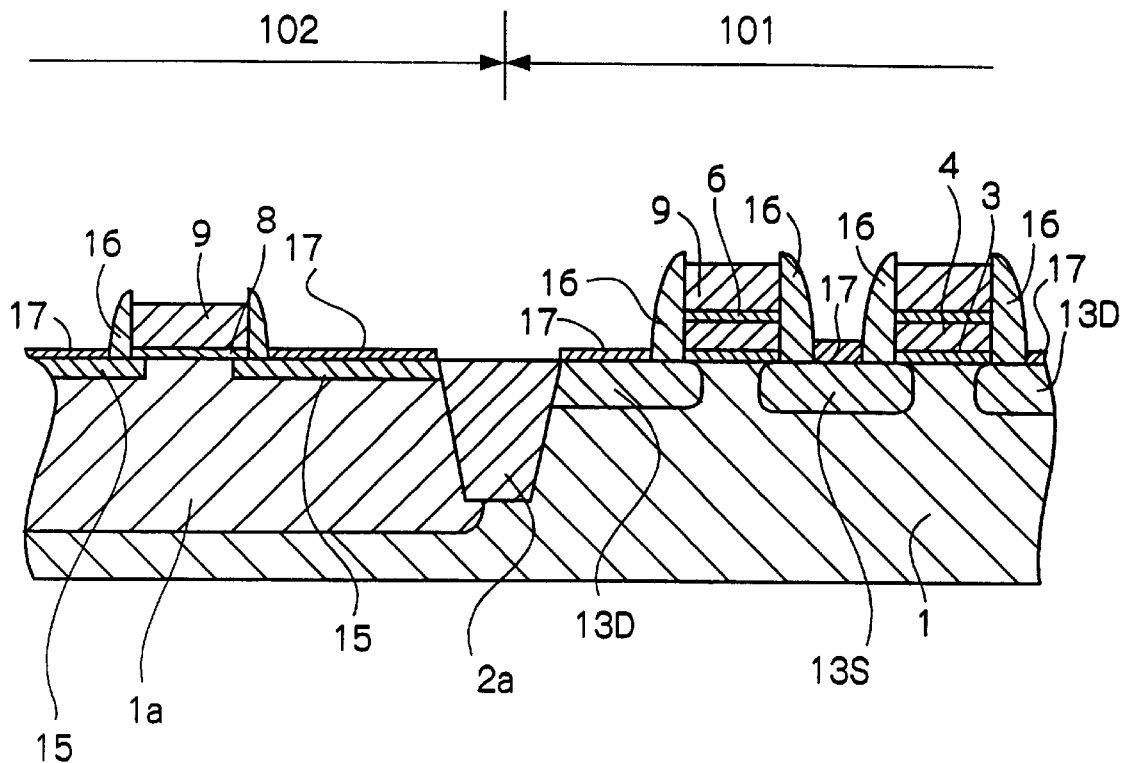
FIG. 29A and FIG. 29B are sectional views showing the conventional method of manufacturing the nonvolatile memory and showing a step subsequent to the step shown in FIG. 28A and FIG. 28B.
Figure 29B:
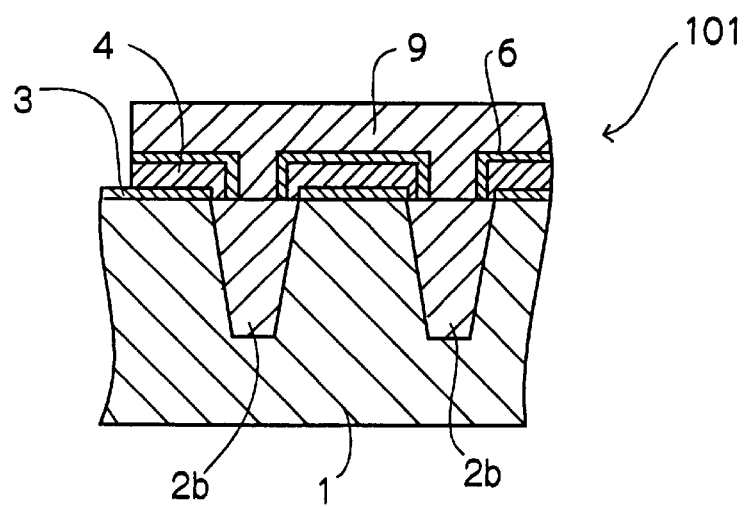
Figure 30A:
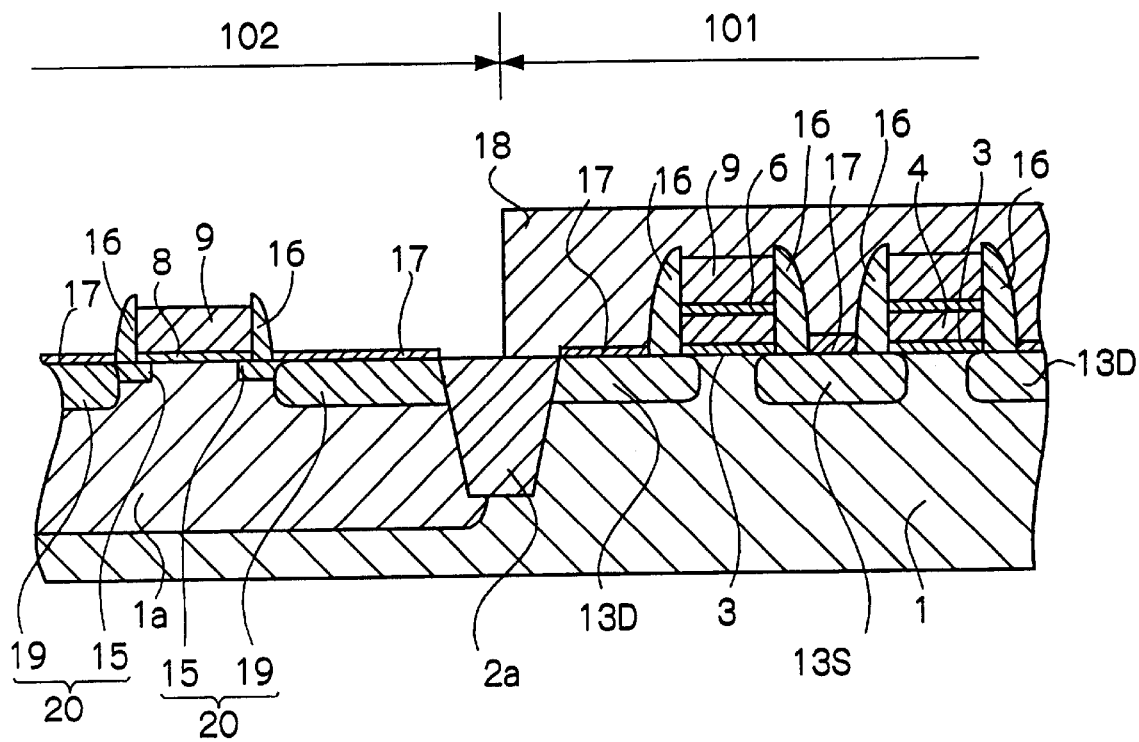
FIG. 30A and FIG. 30B are sectional views showing the conventional method of manufacturing the nonvolatile memory and showing a step subsequent to the step shown in FIG. 29A and FIG. 29B.
Figure 30B:
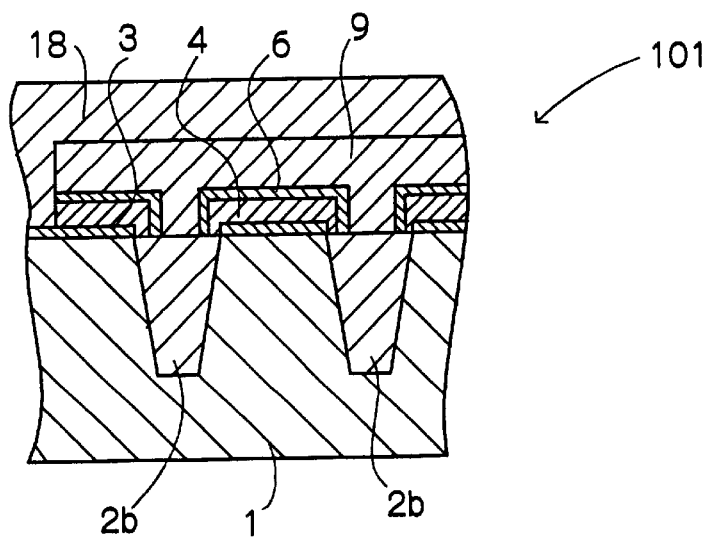
Figure 31A:
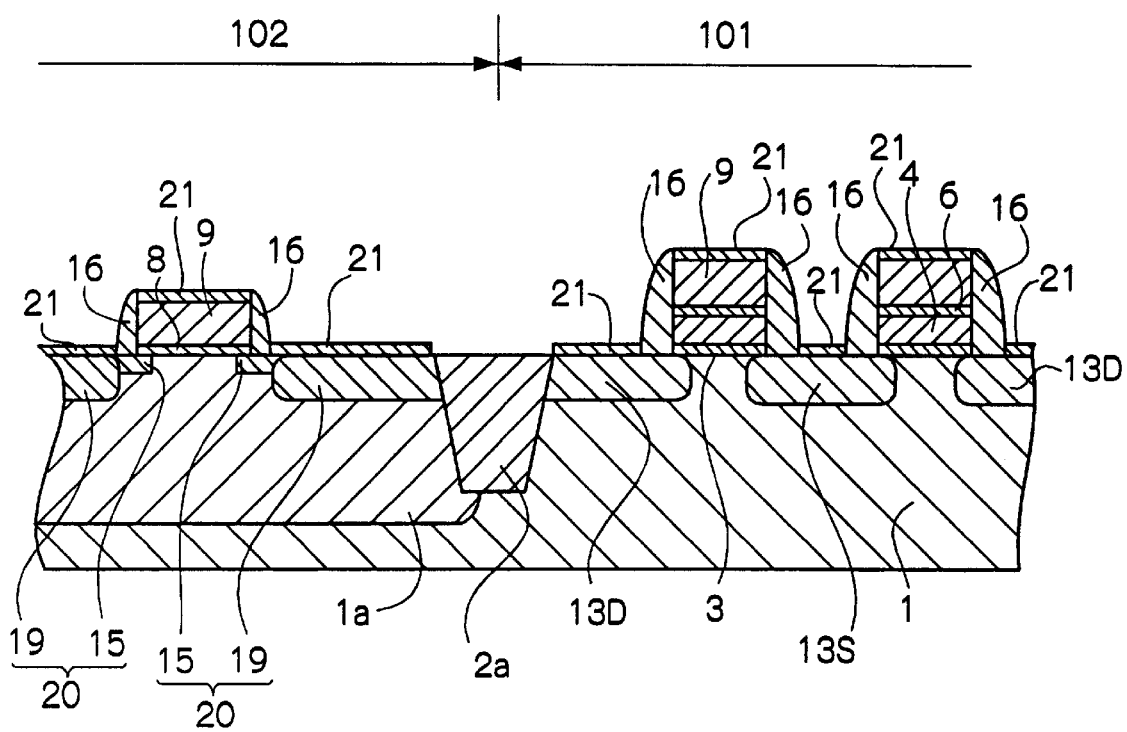
FIG. 31A and FIG. 31B are sectional views showing the conventional method of manufacturing the nonvolatile memory and showing a step subsequent to the step shown in FIG. 30A and FIG. 30B.
Figure 31B:
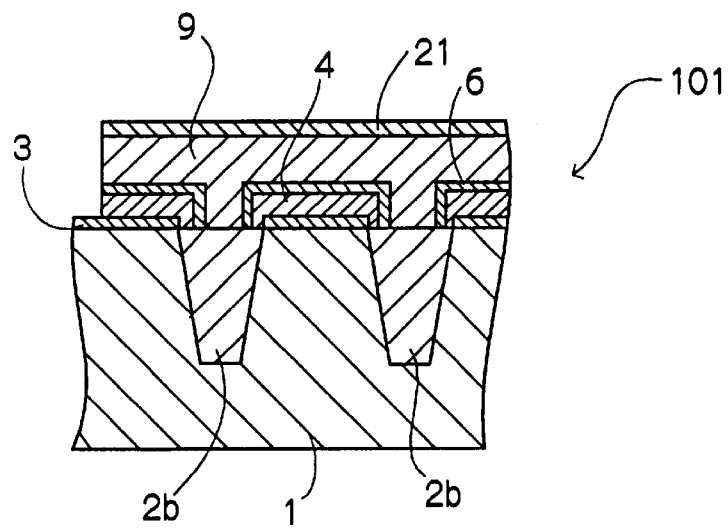
Figure 32A:
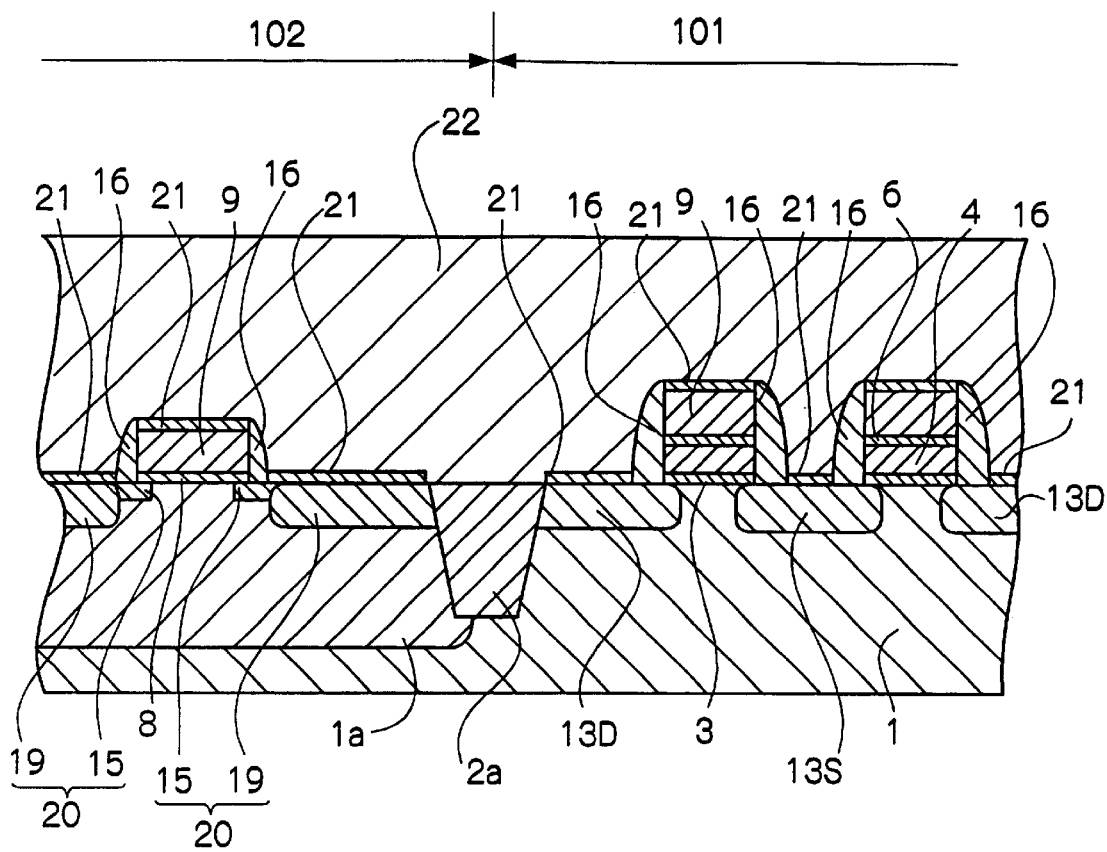
FIG. 32A and FIG. 32B are sectional views showing the conventional method of manufacturing the nonvolatile memory and showing a step subsequent to the step shown in FIG. 31A and FIG. 31B.
Figure 32B:
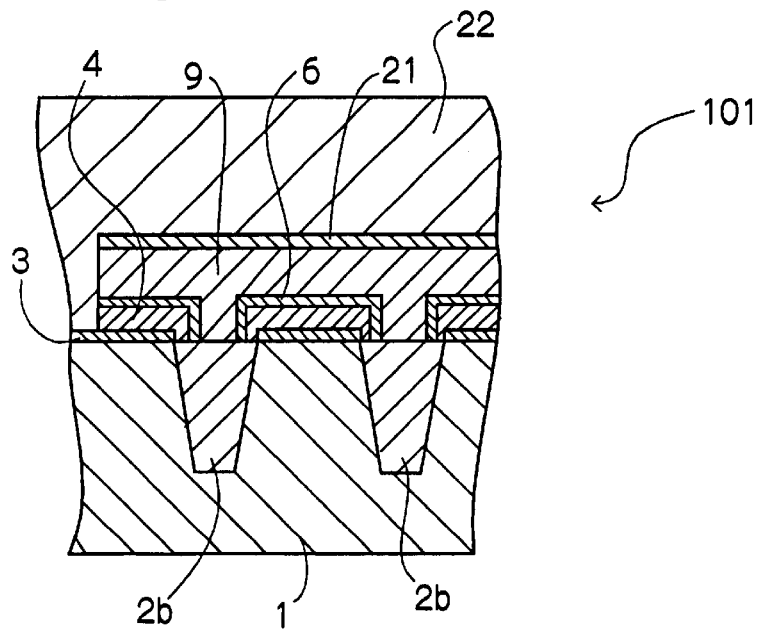

A tunnel oxide film 3 shown in FIG. 15A and FIG. 15B can be formed by a thermal oxidation method, and the thickness thereof is, for example, about 10 nm. An insulating film 6 shown in FIG. 17A and FIG. 17B is, for example, a silicon oxide film, and the thickness thereof is, for example, about 20 nm. A polycrystalline silicon film 9 shown in FIG. 20A and FIG. 20B contains, for example, doped amorphous silicon (DAS), and a silicon nitride film 10 is, for example, an $Si_3N_4$ film. The thicknesses of the gate insulating film 8, the polycrystalline silicon film 9, and the silicon nitride film 10 are, for example, 5 nm, 180 nm, and 20 nm to 90 nm, respectively.

When the source diffusion layer 13S and the drain diffusion layer 13D are formed, arsenic may be doped, for example, at an acceleration voltage of about 50 keV and a dose amount of about $5.0 \times 10^{14}$ cm$^{-2}$ $^2$. In the subsequent doping of phosphorous into only the source diffusion layer 13S, it is suitable to first dope arsenic, for example, at an acceleration voltage of about 50 keV and a dose amount of about $5.0 \times 10^{15}$ cm$^{-2}$ and thereafter dope phosphorous, for example, at an acceleration voltage of about 60 keV and a dose amount of about $2.0 \times 10^{14}$ cm$^{-2}$ $^2$. Moreover, the source diffusion layer 13S may be formed by doping an N-type impurity, for example, at an acceleration voltage of about 40 keV to about 60 keV and a dose amount of about $10^{15}$ cm$^{-2}$.

When sidewall insulating films 16 are formed, anisotropic etching to the depth of 110 nm (100 nm+10% there of) may be performed after an oxide film (not shown), for example, with a thickness of 100 nm is formed.

In the present embodiment, after the sidewall oxide films (sidewall spacers) 16 are formed as shown in FIG. 1A and FIG. 1B and FIG. 27A and FIG. 27B, a silicon oxide film 31 is formed by thermal oxidation on condition that the thickness thereof on the surface of the low-concentration diffusion layer 15 is about 3 nm. An atmosphere on this occasion is a dry oxygen atmosphere, for example, at a temperature of 800° C. As a result, the silicon oxide film 31 with a thickness of about 12 nm is formed on the surface of the source diffusion layer 13S due to oxidation enhanced diffusion (enhanced oxidation). Moreover, the silicon oxide film 31 is also formed on the surface of the drain diffusion layer 13D. By the formation of the silicon oxide film 31, damaged portions existing on the surface of each of the diffusion layers are incorporated into the silicon oxide film 31.

Figure 3A:
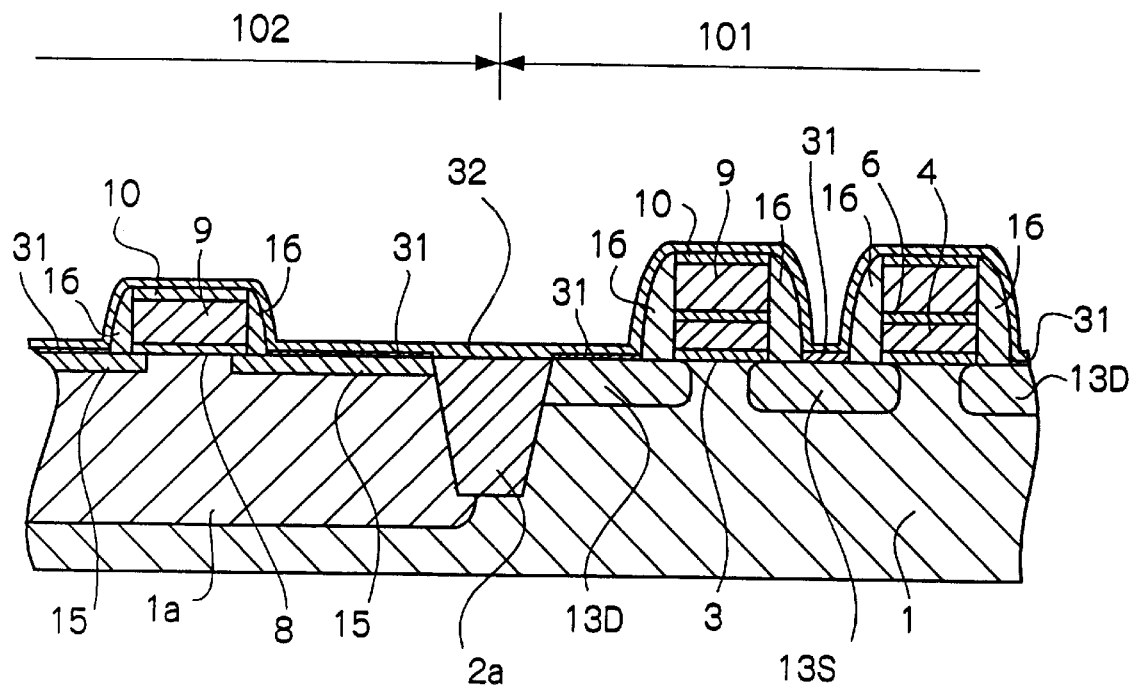
FIG. 3A and FIG. 3B are sectional views showing the method of manufacturing the semiconductor device according to the embodiment of the present invention and showing a step subsequent to the step shown in FIG. 2A and FIG. 2B.
Figure 3B:
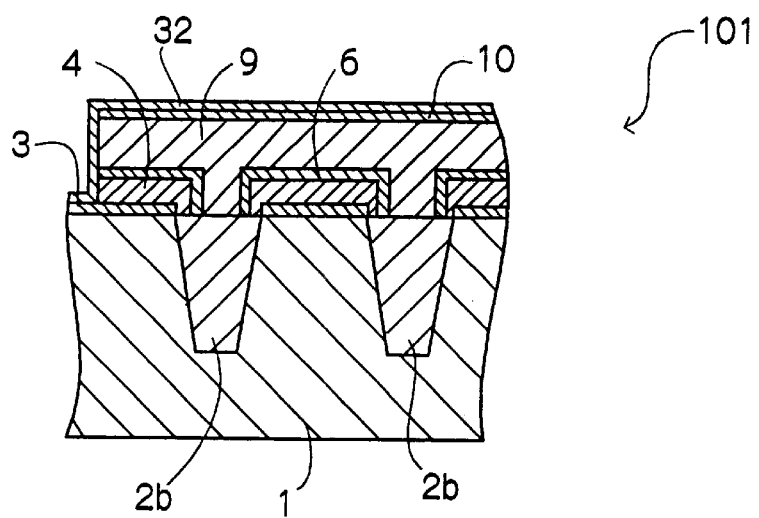

Subsequently, as shown in FIG. 3A and FIG. 3B, a silicon nitride film 32 is formed on the entire surface. The thickness of the silicon nitride film 32 is, for example, 30 nm to 40 nm.

Figure 4A:
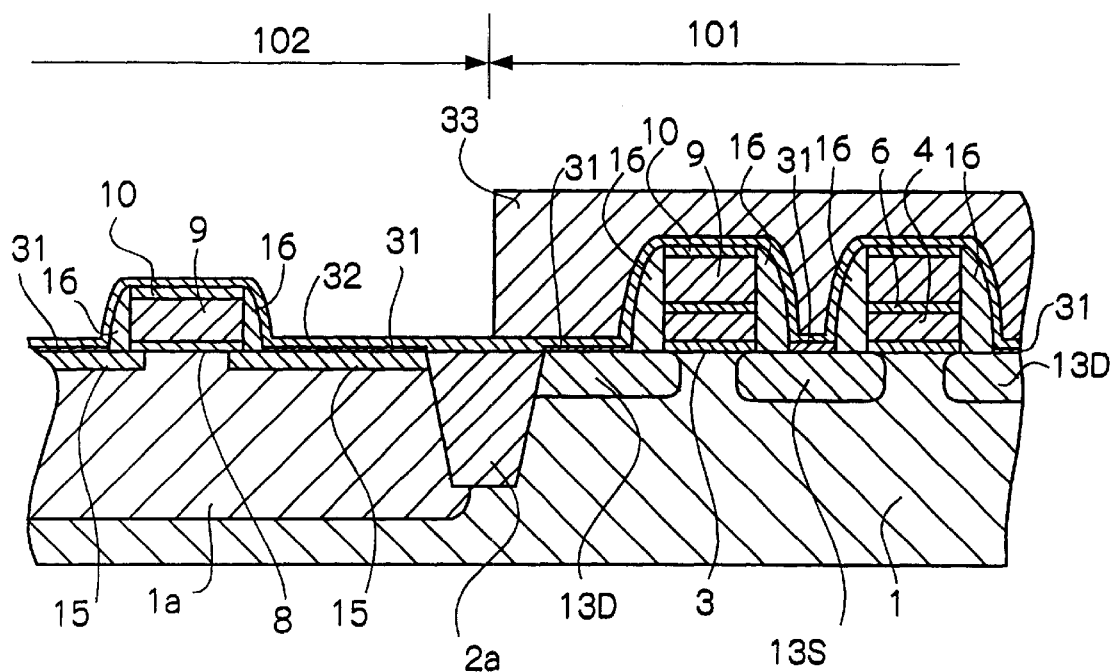
FIG. 4A and FIG. 4B are sectional views showing the method of manufacturing the semiconductor device according to the embodiment of the present invention and showing a step subsequent to the step shown in FIG. 3A and FIG. 3B.
Figure 4B:
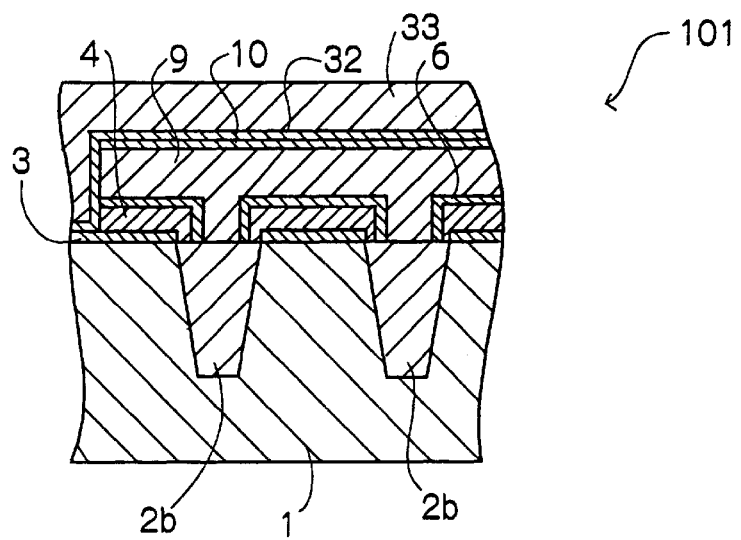

Thereafter, as shown in FIG. 4A and FIG. 4B, a resist film 33 which allows a peripheral transistor region 102 to be exposed is formed.

Figure 5A:
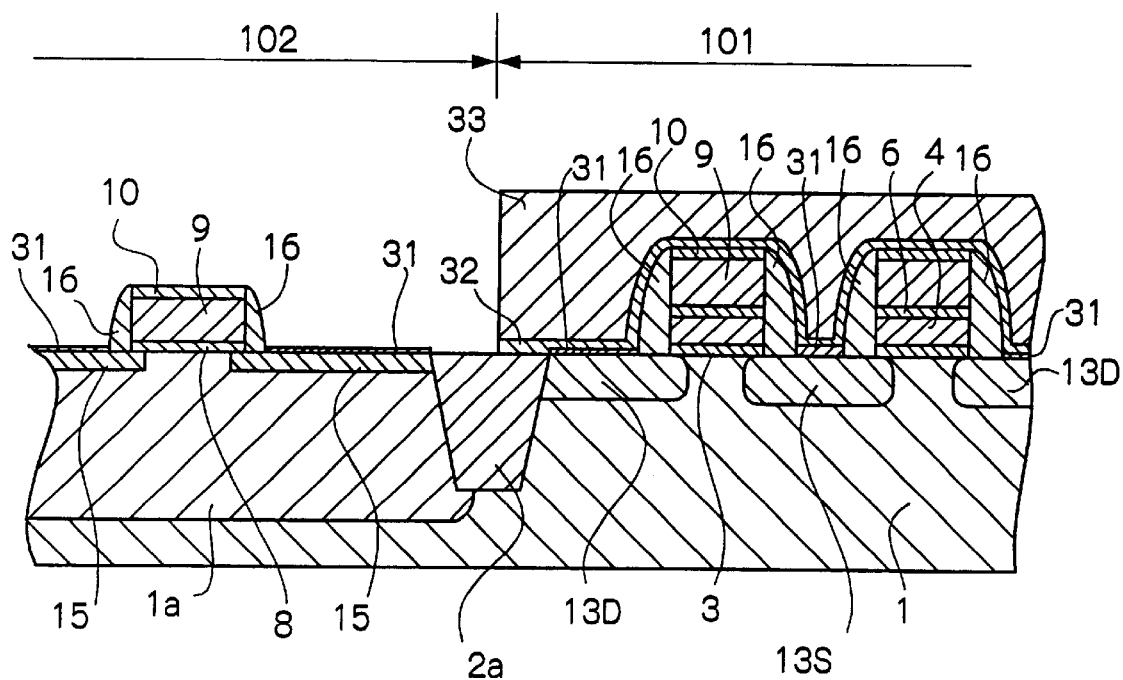
FIG. 5A and FIG. 5B are sectional views showing the method of manufacturing the semiconductor device according to the embodiment of the present invention and showing a step subsequent to the step shown in FIG. 4A and FIG. 4B.
Figure 5B:
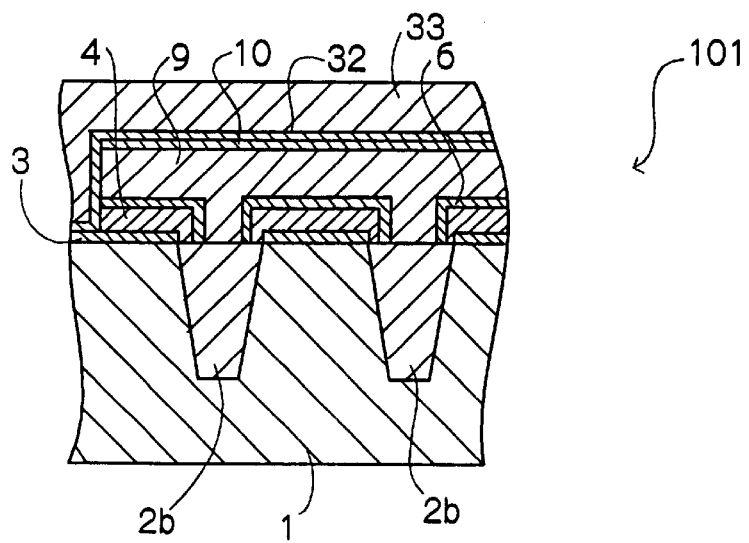

Then, as shown in FIG. 5A and FIG. 5B, with the resist film 33 as a mask, the silicon nitride film 32 is removed by etching.

Figure 6A:
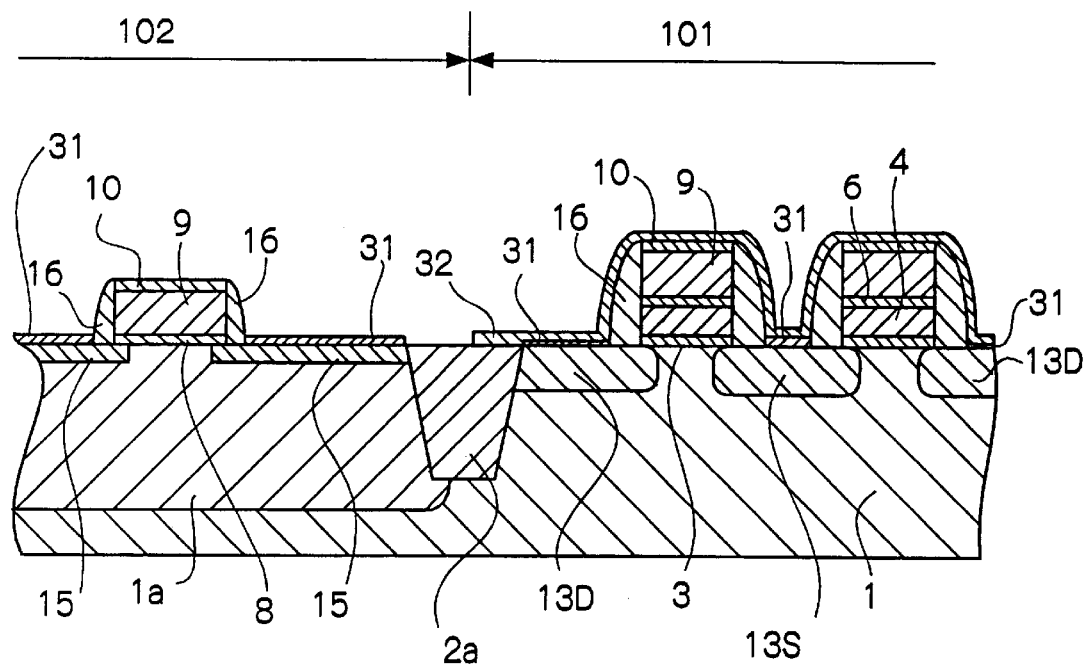
FIG. 6A and FIG. 6B are sectional views showing the method of manufacturing the semiconductor device according to the embodiment of the present invention and showing a step subsequent to the step shown in FIG. 5A and FIG. 5B.
Figure 6B:
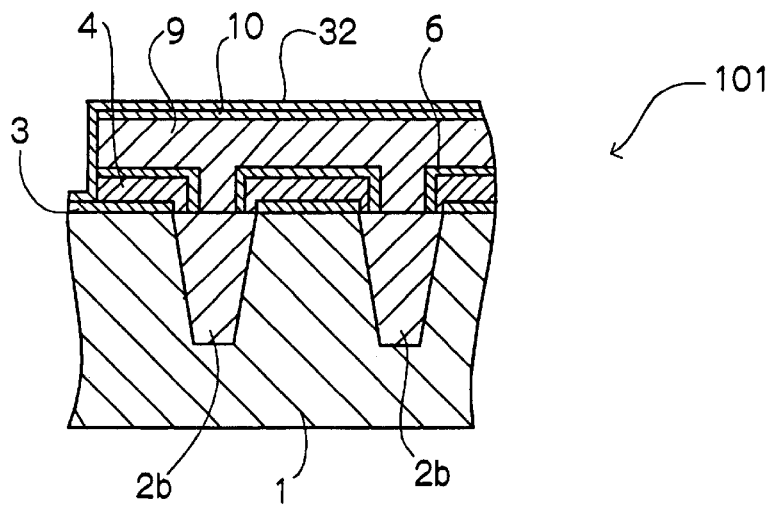

Thereafter, as shown in FIG. 6A and FIG. 6B, the resist film 33 is removed, and thermal oxidation is performed on condition that the thickness of the silicon oxide film 31 formed on the surface of the low-concentration diffusion layer 15 is grown to about 3.5 nm. An atmosphere on this occasion is a dry oxygen atmosphere, for example, at a temperature of 800° C. On this occasion, since the silicon oxide film 31 formed on the surface of each of the source diffusion layer 13S and the drain diffusion layer 13D is covered with the silicon nitride film 32, it does not grow.

Figure 7A:
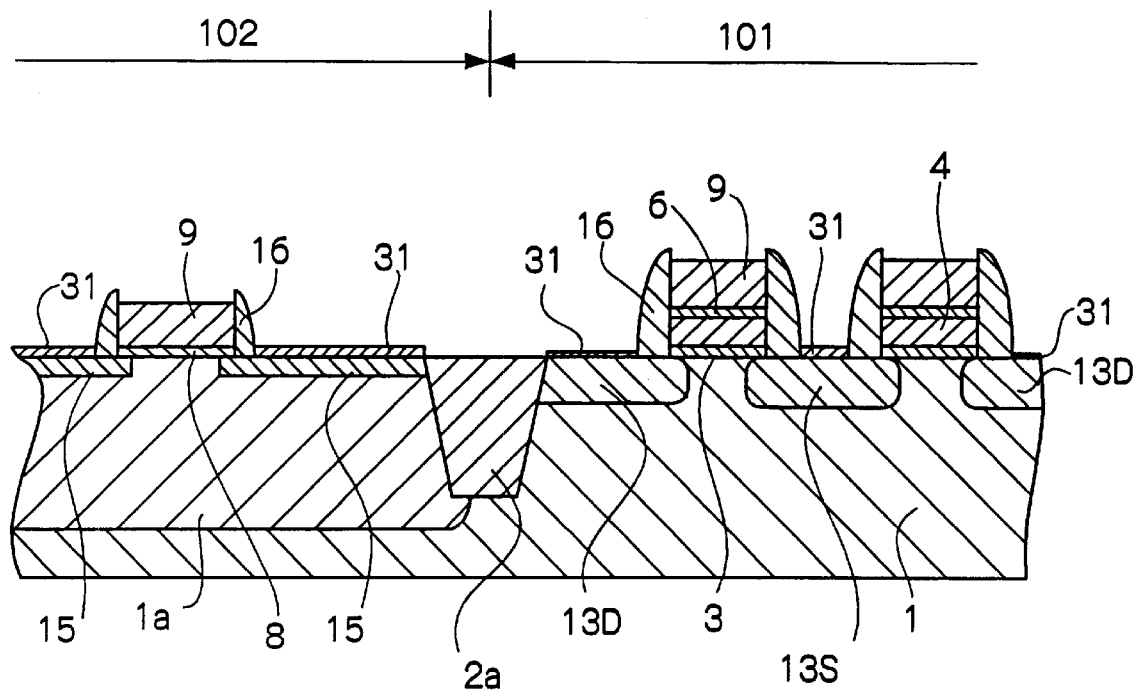
FIG. 7A and FIG. 7B are sectional views showing the method of manufacturing the semiconductor device according to the embodiment of the present invention and showing a step subsequent to the step shown in FIG. 6A and FIG. 6B.
Figure 7B:
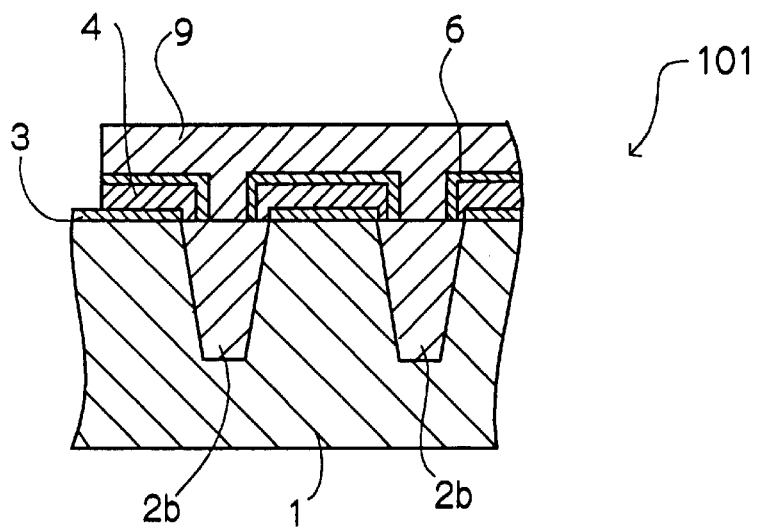

As shown in FIG. 7A and FIG. 7B, the silicon nitride films 32 and 10 are removed by wet processing. On this occasion, the silicon oxide film 31 is formed on the surface of each of the source diffusion layer 13S, the drain diffusion layer 13D, and the low-concentration diffusion layer 15, and hence, these diffusion layers are not damaged.

Figure 8A:
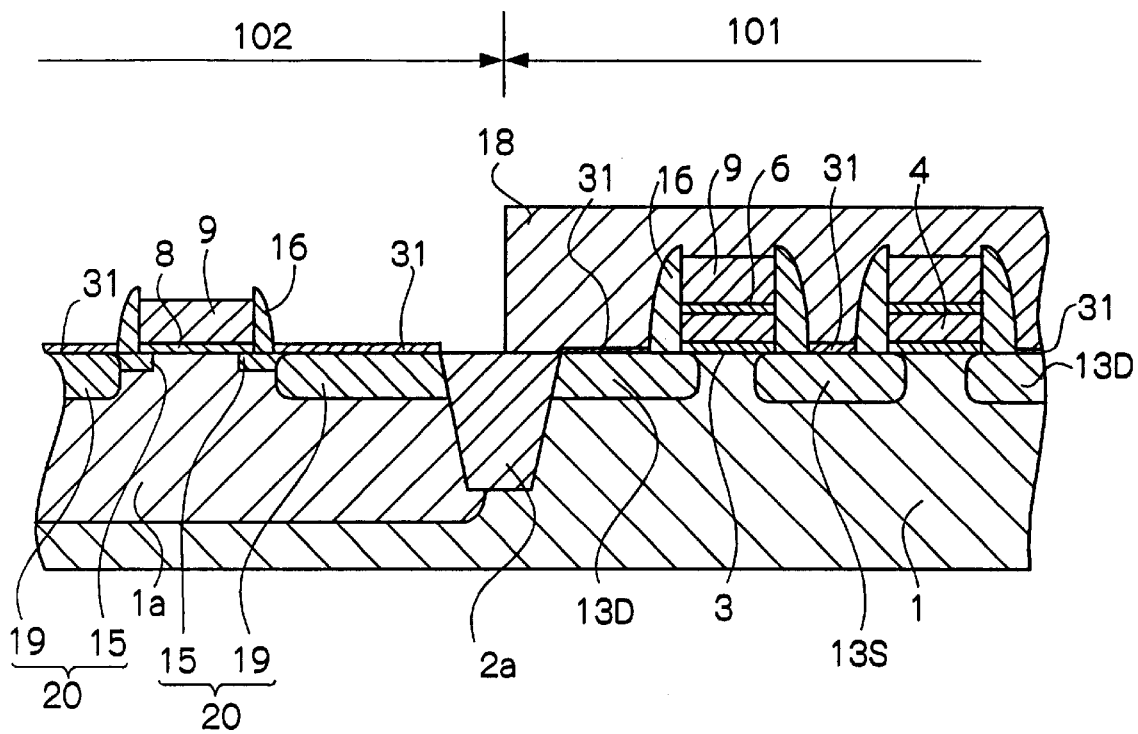
FIG. 8A and FIG. 8B are sectional views showing the method of manufacturing the semiconductor device according to the embodiment of the present invention and showing a step subsequent to the step shown in FIG. 7A and FIG. 7B.
Figure 8B:
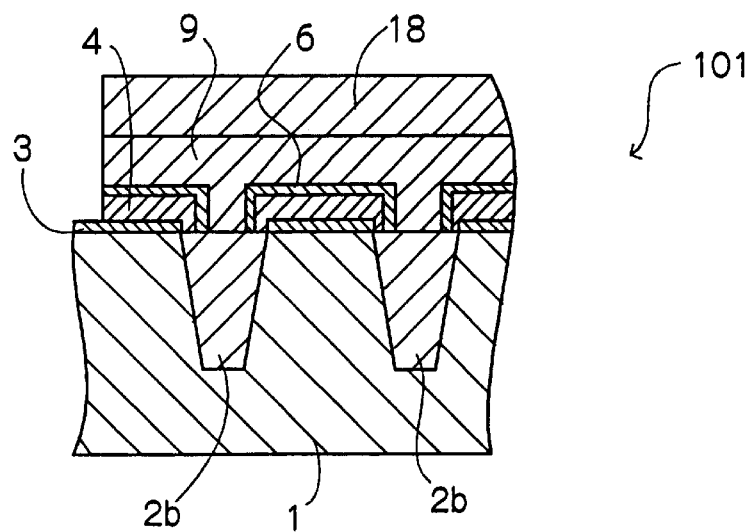

Subsequently, as shown in FIG. 8A and FIG. 8B, a resist film 18 which allows the peripheral transistor region 102 to be exposed is formed, and thereafter, by doping a P-type impurity with a higher concentration than when the low-concentration diffusion layer 15 is formed into the surface of the semiconductor substrate 1 in a self-alignment manner by an impurity doping technique, a high-concentration diffusion layer 19 is formed. A source/drain diffusion layer 20 with an LDD structure is composed of the low-concentration diffusion layer 15 and the high-concentration diffusion layer 19.

Figure 9A:
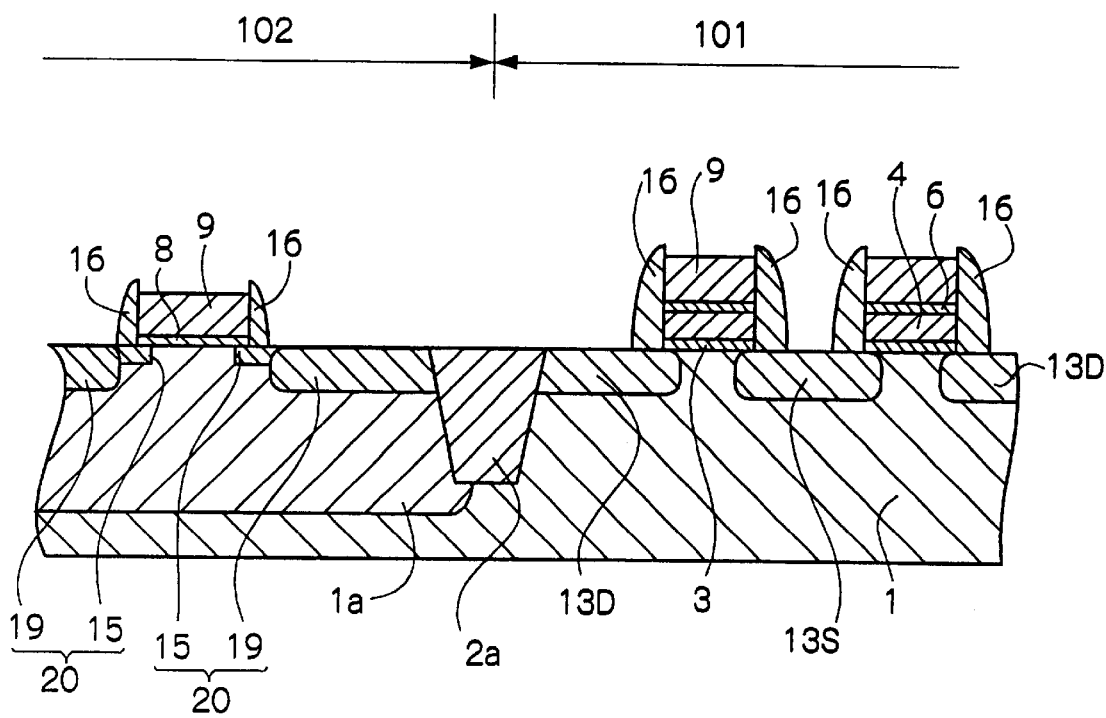
FIG. 9A and FIG. 9B are sectional views showing the method of manufacturing the semiconductor device according to the embodiment of the present invention and showing a step subsequent to the step shown in FIG. 8A and FIG. 8B.
Figure 9B:
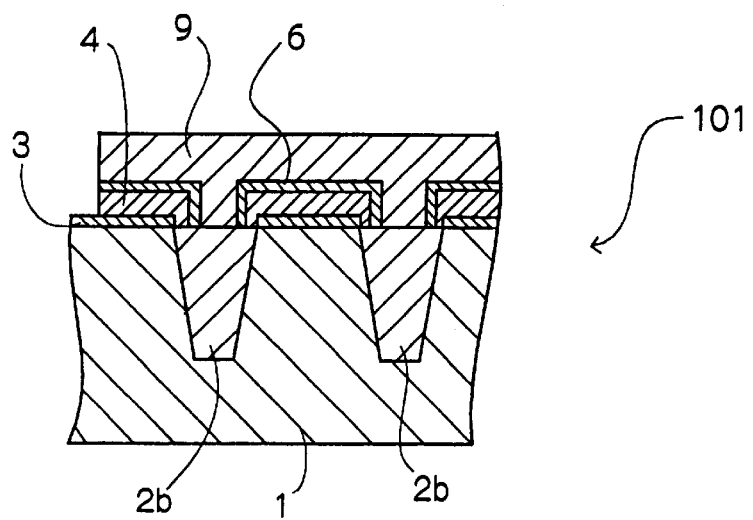

Thereafter, as shown in FIG. 9A and FIG. 9B, the resist film 18 is removed, and further the silicon oxide film 31 is removed by the wet processing.

Figure 10A:
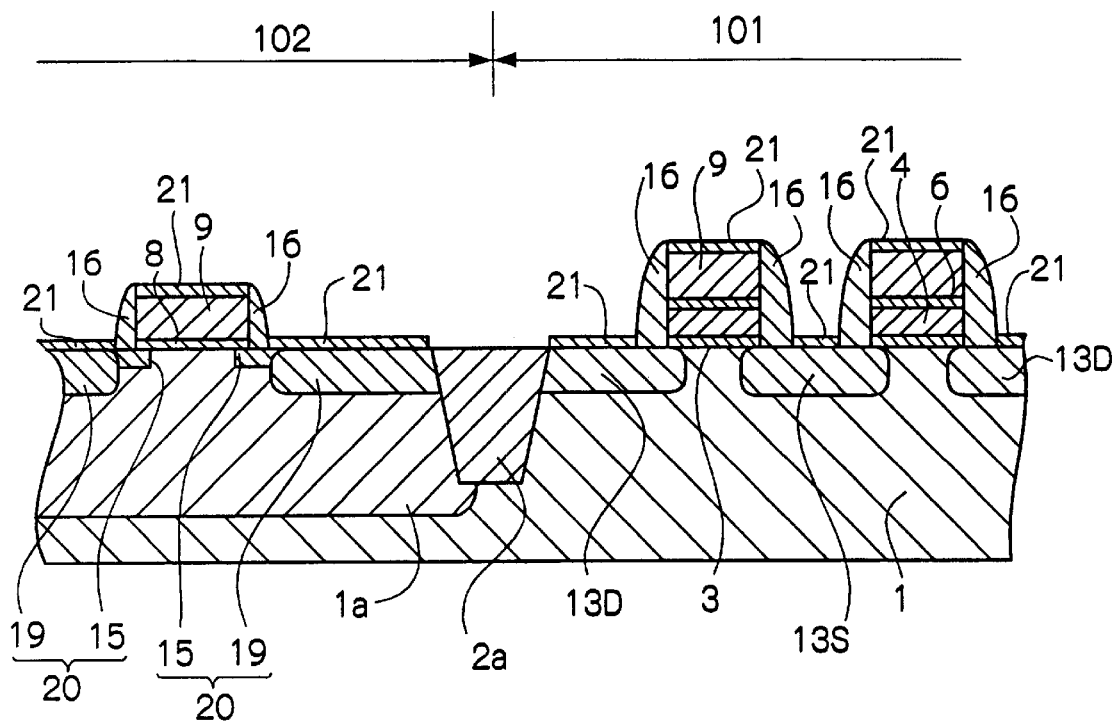
FIG. 10A and FIG. 10B are sectional views showing the method of manufacturing the semiconductor device according to the embodiment of the present invention and showing a step subsequent to the step shown in FIG. 9A and FIG. 9B.
Figure 10B:
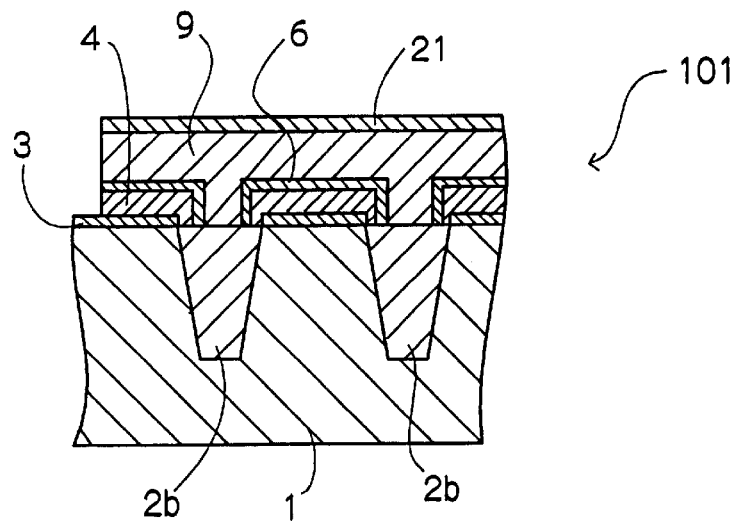

As shown in FIG. 10A and FIG. 10B, a stacked film (not shown) composed of a Co film and a TiN film is then formed on the entire surface. The stacked film and each of the source diffusion layer 13S, the drain diffusion layer 13D, the source/drain diffusion layer 20, and the polycrystalline silicon film 9 are reached with each other by RTA to form a metal reaction layer (CoSi layer) 21. Moreover, after the unreacted stacked film is removed, RTA is performed so that the resistance of the metal reaction layer 21 is lowered. In other words, the metal layer 21 with a low resistance value is formed by a salicide process.

Figure 11A:
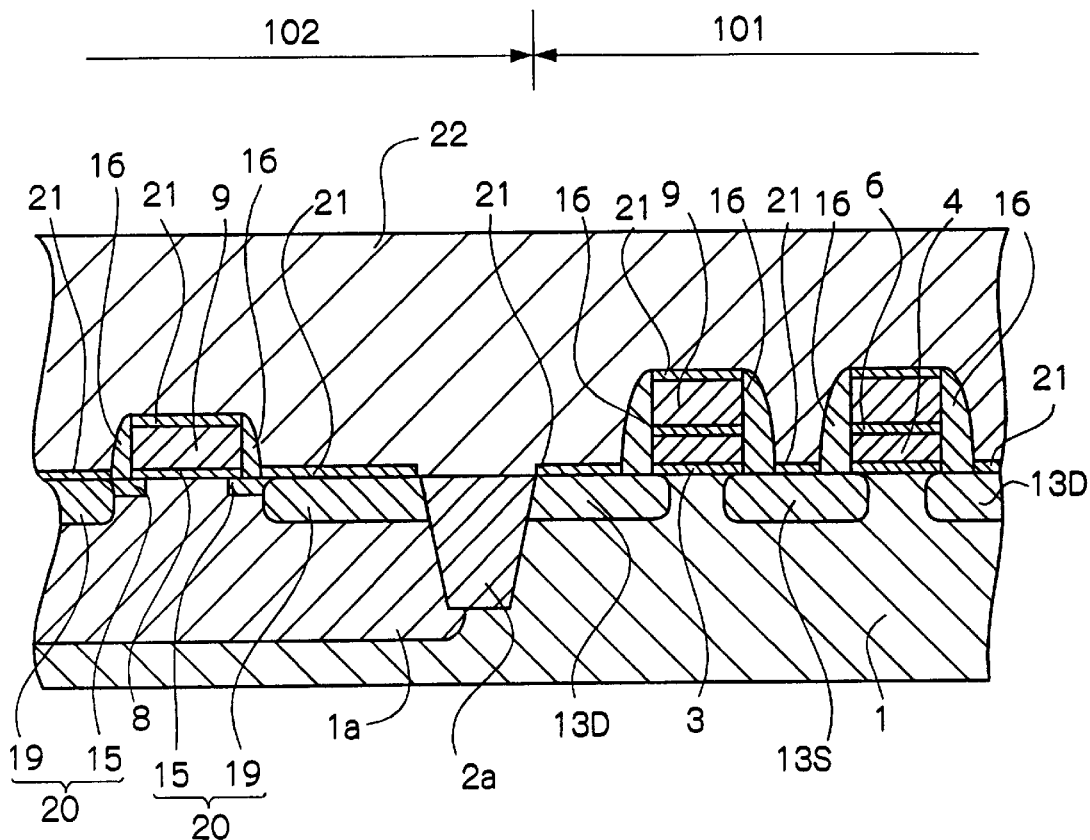
FIG. 11A and FIG. 11B are sectional views showing the method of manufacturing the semiconductor device according to the embodiment of the present invention and showing a step subsequent to the step shown in FIG. 10A and FIG. 10B.
Figure 11B:
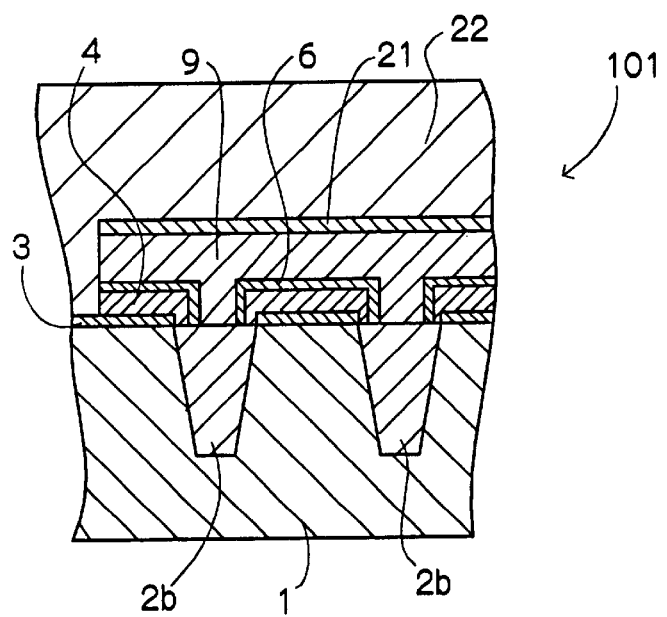

Subsequently, as shown in FIG. 11A and FIG. 11B, a bulk interlayer insulating film 22 is formed on the entire surface. Thereafter, the formation of contact holes in the interlayer insulation film 22, the formation of wires, and so on are performed by a well-known method, and thus the nonvolatile memory is completed.

According to the embodiment described above, the silicon oxide film 31 in the memory cell array region 101 is covered with the silicon nitride film 32 on the occasion of oxidation treatment for thickening the silicon oxide film 31 in the peripheral transistor region 102, whereby the growth of the silicon oxide film 31 in the memory cell array region 101 is prevented. Accordingly, it is unnecessary to remove the silicon oxide film 31 under such condition that the element isolation insulating films 2a and 2b and the sidewall insulating films 16 recede thereafter. Hence, it becomes possible to manufacture a flash memory with a good characteristic at a high yield rate.

Incidentally, in the example shown in FIG. 13, a source diffusion layer S is shared by a plurality of memory cells 103 arranged in a direction in which a control gate CG extends, but the present invention is not limited to a method of manufacturing such a nonvolatile memory. The present invention can be applied to a semiconductor device in which a source diffusion layer is individually provided in each of the plurality of memory cells 103 arranged in the direction in which the control gate CG extends. However, also in this case, it is preferable that one source diffusion layer be shared by two memory cells arranged in a direction perpendicular to the direction in which the control gate CG extends.

Figure 12:
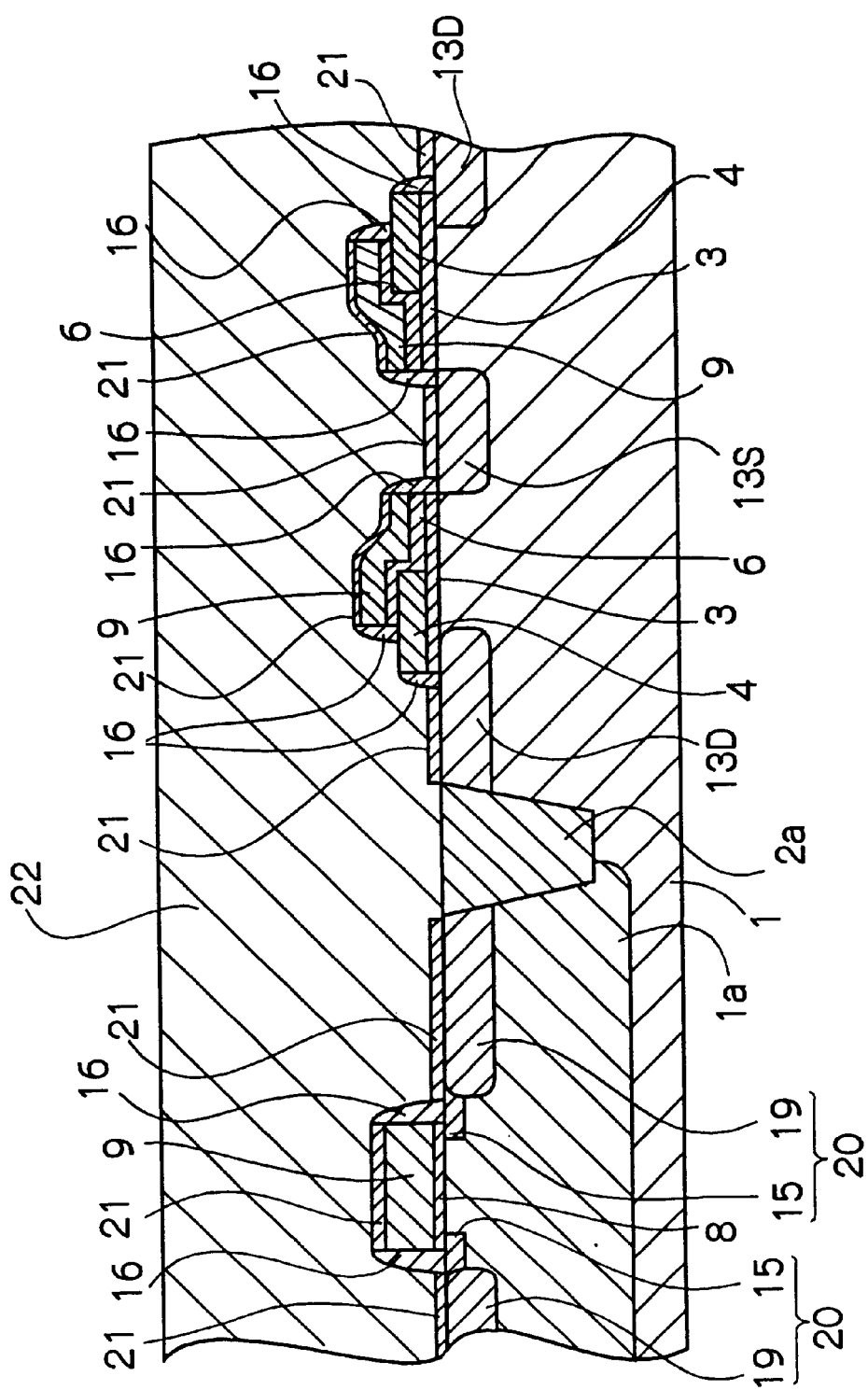
FIG. 12 is a sectional view showing the structure of a split-gate type nonvolatile memory.

Moreover, the present invention can be also applied to the manufacture of a split-gate type nonvolatile memory. FIG. 12 is a sectional view showing the structure of the split-gate type nonvolatile memory. Incidentally, FIG. 12 is a sectional view corresponding to FIG. 1A to FIG. 11A. Also in such a split-gate type nonvolatile memory, enhanced oxidation tends to occur since an impurity with an excessive concentration is doped into the source diffusion layer 13S from the viewpoint of surface protection. The application of the present invention makes it possible to prevent the occurrence of defects in the memory cell array region 101 at the time of removal of an oxide film while an oxide film capable of fully protecting the surface of the low-concentration diffusion layer 15 is formed.

Furthermore, as described above, enhanced oxidation in the source diffusion layer is marked especially in a NOR-type nonvolatile memory, and hence the present invention is especially effective in the NOR-type nonvolatile memory.

As described in detail above, according to the present invention, after the silicon oxide film is formed on the surface of each of the diffusion layers, the silicon oxide film only in the peripheral transistor region is thickened, whereby the silicon oxide film in the memory cell array region can avoid being thickened more than necessary. Therefore, the silicon oxide film in the memory cell array, which is made unnecessary, can be removed while the recession of the element isolation insulating films, the sidewall insulating films, and the like is avoided.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of manufacturing a semiconductor device comprising a memory cell array region and a peripheral transistor region provided on the periphery of the memory cell array region, comprising the steps of:
    forming a diffusion layer provided in each of memory cells in said memory cell forward thereon array region and a diffusion layer provided in said peripheral transistor region on the surface of a semiconductor substrate;
    forming a silicon oxide film on the surface of each of said diffusion layers by oxidation treatment; and
    thickening said silicon oxide film only in said peripheral transistor region by subsequent oxidation treatment.

2. The method of manufacturing the semiconductor device according to claim 1,
    wherein the step of thickening said silicon oxide film comprises the steps of:
        forming a first silicon nitride film on said silicon oxide film in said memory cell array region; and
        heating entirely the semiconductor substrate in an oxidation atmosphere.

3. The method of manufacturing the semiconductor device according to claim 1,
    wherein the step of forming said diffusion layers comprises the steps of, as separate steps:
        forming said diffusion layer provided in each of said memory cells in said memory cell array region; and
        forming said diffusion layer provided in said peripheral transistor region.

4. The method of manufacturing the semiconductor device according to claim 3,
    wherein, in forming said diffusion layer provided in each of said memory cells in said memory cell array region, two kinds of diffusion layers different in impurity concentration are formed.

5. The method of manufacturing the semiconductor device according to claim 4,
    wherein the impurity concentration of the diffusion layer out of said two kinds of diffusion layers which has a higher impurity concentration is made higher than the impurity concentration of said diffusion layer provided in said peripheral transistor region.

6. The method of manufacturing the semiconductor device according to claim 4,
    wherein the step of forming said two kinds of diffusion layers comprises the steps of:
        doping a first conductivity type impurity into regions where said diffusion layers are to be formed at the same concentration; and
        further doping a first conductivity type impurity into only a region where said diffusion layer out of said two kinds of diffusion layers which has the higher impurity concentration is to be formed.

7. The method of manufacturing the semiconductor device according to claim 1, further comprising the step of, before forming said diffusion layers:
    forming a control gate and a gate of transistor, which are made of the same semiconductor film, in said memory cell array region and in said peripheral transistor region, respectively, at the same time, and forming a floating gate extending in the same direction as said control gate in each of said memory cells in said memory cell array region,
    wherein the step of forming said diffusion layers comprises the step of doping an impurity into the surface of said semiconductor substrate in a self-alignment manner with said control gate and said gate of said transistor as a mask.

8. The method of manufacturing the semiconductor device according to claim 7,
    wherein the step of thickening said silicon oxide film comprises the steps of:
        forming a first silicon nitride film on said silicon oxide film in said memory cell array region; and
        heating entirely the semiconductor substrate in an oxidation atmosphere,
    the step of forming said control gate and said gate of said transistor comprises the steps of:
        forming said semiconductor film;
        forming a second silicon nitride film on said semiconductor film; and
        patterning said semiconductor film and said second silicon nitride film with the same mask, and
    said method further comprising the step of, after thickening said silicon oxide film:
        removing said first silicon nitride film and said second silicon nitride film by wet processing.

9. The method of manufacturing the semiconductor device according to claim 2,
    wherein the step of forming said first silicon nitride film comprises the steps of:
        forming a nitride film on the entire surface;
        forming a resist film in which an opening is formed in a region matching with said memory cell array region on said nitride film; and
        etching said nitride film with said resist film as a mask.

10. The method of manufacturing the semiconductor device according to claim 2,
    wherein the thickness of said first silicon nitride film is set at 20 nm to 90 nm.

11. The method of manufacturing the semiconductor device according to claim 1, wherein said memory cell array region includes a plurality of nonvolatile memory cells.

12. The method of manufacturing the semiconductor device according to claim 11,
wherein said nonvolatile memory cell is a NOR-type memory cell.

13. The method of manufacturing the semiconductor device according to claim 11,
wherein said nonvolatile memory cell is a split-gate type memory cell.

14. The method of manufacturing the semiconductor device according to claim 1,
wherein the conductivity type of said semiconductor substrate is a P type.

15. The method of manufacturing the semiconductor device according to claim 1, further comprising the step of, before forming said diffusion layers:
forming a well of the conductivity type opposite to the conductivity type of said semiconductor substrate on the surface of said semiconductor substrate in said peripheral transistor region.

16. The method of manufacturing the semiconductor device according to claim 7, further comprising the step of, after forming said control gate, said floating gate and said gate of said transistor:
forming a sidewall insulating film on each side of said control gate, said floating gate, and said gate of said transistor.

17. The method of manufacturing the semiconductor device according to claim 1, further comprising the step of, after thickening said silicon oxide film:
forming a source/drain diffusion layer with an LDD structure by doping an impurity into said diffusion layer in said peripheral transistor region.

\* \* \* \* \*